United States Patent
Basak et al.

(10) Patent No.: US 11,655,560 B2
(45) Date of Patent: *May 23, 2023

(54) HIGH RESISTIVITY SINGLE CRYSTAL SILICON INGOT AND WAFER HAVING IMPROVED MECHANICAL STRENGTH

(71) Applicant: GlobalWafers Co., Ltd., Hsinchu (TW)

(72) Inventors: Soubir Basak, Chandler, AZ (US); Igor Peidous, Eaton, OH (US); Carissima Marie Hudson, St. Charles, MO (US); Hyungmin Lee, ChungNam (KR); Byungchun Kim, ChungNam (KR); Robert J. Falster, London (GB)

(73) Assignee: GlobalWafers Co., Ltd., Hsinchu (TW)

(*) Notice: Subject to any disclaimer, the term of this patent is extended or adjusted under 35 U.S.C. 154(b) by 15 days.

This patent is subject to a terminal disclaimer.

(21) Appl. No.: 17/471,641

(22) Filed: Sep. 10, 2021

(65) Prior Publication Data

US 2022/0056616 A1    Feb. 24, 2022

Related U.S. Application Data

(63) Continuation of application No. 16/303,195, filed as application No. PCT/US2017/036061 on Jun. 6, 2017, now Pat. No. 11,142,844.

(Continued)

(51) Int. Cl.
  *C30B 29/06* (2006.01)
  *C30B 15/00* (2006.01)
  (Continued)

(52) U.S. Cl.
  CPC .......... *C30B 29/06* (2013.01); *C30B 15/007* (2013.01); *C30B 15/10* (2013.01); *C30B 15/305* (2013.01);
  (Continued)

(58) Field of Classification Search
  CPC ..... C30B 15/007; C30B 15/305; C30B 29/06; H01L 21/02005; H01L 21/02123; H01L 21/28167
  See application file for complete search history.

(56) References Cited

U.S. PATENT DOCUMENTS

| 4,501,060 A | 2/1985 | Frye et al. |
| 4,755,865 A | 7/1988 | Wilson et al. |

(Continued)

FOREIGN PATENT DOCUMENTS

| CN | 101165224 A | 4/2008 |
| CN | 102312292 A | 1/2012 |

(Continued)

OTHER PUBLICATIONS

Fukuda, Tetsuo et al., Mechanical strength of silicon crystals with oxygen and/or germanium impurities, Applied Physics Letter, 1992, pp. 1184-1186, vol. 60.

(Continued)

*Primary Examiner* — Robert M Kunemund
(74) *Attorney, Agent, or Firm* — Armstrong Teasdale LLP

(57) ABSTRACT

A method for preparing a single crystal silicon ingot and a wafer sliced therefrom are provided. The ingots and wafers comprise nitrogen at a concentration of at least about $1 \times 10^{14}$ atoms/cm$^3$ and/or germanium at a concentration of at least about $1 \times 10^{19}$ atoms/cm$^3$, interstitial oxygen at a concentration of less than about 6 ppma, and a resistivity of at least about 1000 ohm cm.

30 Claims, 11 Drawing Sheets

Related U.S. Application Data

(60) Provisional application No. 62/347,143, filed on Jun. 8, 2016, provisional application No. 62/347,145, filed on Jun. 8, 2016.

(51) Int. Cl.
| | |
|---|---|
| *C30B 15/10* | (2006.01) |
| *C30B 15/30* | (2006.01) |
| *H01L 21/02* | (2006.01) |
| *H01L 21/28* | (2006.01) |

(52) U.S. Cl.
CPC .. *H01L 21/02005* (2013.01); *H01L 21/02123* (2013.01); *H01L 21/28167* (2013.01)

(56) References Cited

U.S. PATENT DOCUMENTS

| | | | |
|---|---|---|---|
| 4,968,384 | A | 11/1990 | Asano |
| 5,189,500 | A | 2/1993 | Kusunoki |
| 6,043,138 | A | 3/2000 | Ibok |
| 6,204,205 | B1 | 3/2001 | Yu et al. |
| 6,373,113 | B1 | 4/2002 | Gardner et al. |
| 6,479,166 | B1 | 11/2002 | Heuer et al. |
| 6,544,656 | B1 | 4/2003 | Abe et al. |
| 6,562,127 | B1 | 5/2003 | Kud et al. |
| 6,624,047 | B1 | 9/2003 | Sakaguchi et al. |
| 7,629,054 | B2 | 12/2009 | Umeno |
| 7,868,419 | B1 | 1/2011 | Kerr et al. |
| 7,879,699 | B2 | 2/2011 | Schulze et al. |
| 7,915,716 | B2 | 3/2011 | Pisigan et al. |
| 8,058,137 | B1 | 11/2011 | Or-Bach et al. |
| 8,076,750 | B1 | 12/2011 | Kerr et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu |
| 9,458,554 | B2 | 10/2016 | Mueller et al. |
| 11,142,844 | B2 * | 10/2021 | Basak .................. C30B 15/007 |
| 2002/0090758 | A1 | 7/2002 | Henley et al. |
| 2003/0106482 | A1* | 6/2003 | Kononchuk ............ C30B 29/06 |
| | | | 257/E21.321 |
| 2004/0003769 | A1 | 1/2004 | Tamatasuka et al. |
| 2004/0005740 | A1 | 1/2004 | Lochtefeld et al. |
| 2004/0031979 | A1 | 2/2004 | Lochtefeld et al. |
| 2004/0108537 | A1 | 6/2004 | Tiwari |
| 2004/0213907 | A1 | 10/2004 | Todd et al. |
| 2005/0026432 | A1 | 2/2005 | Atwater, Jr. et al. |
| 2005/0153524 | A1 | 7/2005 | Maa et al. |
| 2005/0167002 | A1 | 8/2005 | Ghyselen et al. |
| 2005/0253224 | A1 | 11/2005 | Ho et al. |
| 2006/0030124 | A1 | 2/2006 | Maa et al. |
| 2006/0033110 | A1 | 2/2006 | Alam et al. |
| 2006/0046431 | A1 | 3/2006 | Blietz et al. |
| 2006/0226482 | A1 | 10/2006 | Suvorov |
| 2007/0032040 | A1 | 2/2007 | Lederer |
| 2007/0054466 | A1 | 3/2007 | Hebras |
| 2007/0066033 | A1 | 3/2007 | Kurita et al. |
| 2007/0200144 | A1 | 8/2007 | Aspar et al. |
| 2008/0171443 | A1 | 7/2008 | Hebras |
| 2008/0299744 | A1 | 12/2008 | Yamazaki et al. |
| 2009/0004426 | A1* | 1/2009 | Falster ................ H01L 21/3225 |
| | | | 257/E21.321 |
| 2009/0004833 | A1 | 1/2009 | Suzuki et al. |
| 2009/0014828 | A1 | 1/2009 | Mizushima et al. |
| 2009/0092810 | A1 | 4/2009 | Lee et al. |
| 2009/0117716 | A1 | 5/2009 | Shimomura et al. |
| 2009/0278233 | A1 | 11/2009 | Pinnington et al. |
| 2009/0283866 | A1* | 11/2009 | Schulze .................. H01L 29/36 |
| | | | 257/E21.135 |
| 2009/0321829 | A1 | 12/2009 | Nguyen et al. |
| 2010/0224968 | A1 | 9/2010 | Kurita et al. |
| 2011/0174362 | A1 | 7/2011 | Tanner et al. |
| 2011/0298083 | A1 | 12/2011 | Yoneda |
| 2012/0091587 | A1 | 4/2012 | Or-Back et al. |
| 2012/0161310 | A1 | 6/2012 | Brindle et al. |
| 2012/0238070 | A1 | 9/2012 | Libbert et al. |
| 2012/0267681 | A1 | 10/2012 | Nemoto et al. |
| 2013/0120951 | A1 | 5/2013 | Zuo et al. |
| 2013/0122672 | A1 | 5/2013 | Or-Bach et al. |
| 2013/0168835 | A1 | 7/2013 | Botula et al. |
| 2013/0193445 | A1 | 8/2013 | Dennard et al. |
| 2013/0294038 | A1 | 11/2013 | Landru et al. |
| 2013/0323153 | A1 | 12/2013 | Hoshi et al. |
| 2013/0344680 | A1 | 12/2013 | Arriagada et al. |
| 2014/0042598 | A1 | 2/2014 | Kitada et al. |
| 2014/0072015 | A1 | 3/2014 | Bedell et al. |
| 2014/0084290 | A1 | 3/2014 | Allibert et al. |
| 2014/0120654 | A1 | 5/2014 | Fujii et al. |
| 2014/0124902 | A1 | 5/2014 | Botula et al. |
| 2014/0273405 | A1 | 9/2014 | Liu et al. |
| 2015/0004778 | A1 | 1/2015 | Botula et al. |
| 2015/0115480 | A1 | 4/2015 | Peidous et al. |
| 2015/0112308 | A1 | 7/2015 | Peidous |
| 2016/0108551 | A1 | 4/2016 | Basak et al. |
| 2017/0033002 | A1 | 2/2017 | Meguro et al. |
| 2017/0345663 | A1 | 11/2017 | Ishizuka et al. |

FOREIGN PATENT DOCUMENTS

| | | |
|---|---|---|
| CN | 103429798 A1 | 12/2013 |
| CN | 103578976 A | 2/2014 |
| EP | 0939430 A2 | 1/1999 |
| EP | 1087041 A | 3/2001 |
| EP | 1865551 A2 | 12/2007 |
| EP | 2426701 A1 | 7/2012 |
| EP | 2503592 A1 | 9/2012 |
| EP | 2579303 A1 | 10/2013 |
| JP | 401315144 A | 12/1989 |
| JP | 2005306653 A | 11/2005 |
| JP | 3750526 B2 | 3/2006 |
| JP | 2007191350 A | 8/2007 |
| JP | 2012253364 A | 12/2012 |
| JP | 2014019660 A | 2/2014 |
| JP | 2016088822 A | 5/2016 |
| KR | 1020090079419 A | 7/2009 |
| KR | 1020090082001 A | 7/2009 |
| WO | 2005010243 A1 | 2/2005 |
| WO | 2009120407 A2 | 10/2009 |
| WO | 2012127006 A1 | 9/2012 |
| WO | 2015112308 A1 | 7/2015 |
| WO | 2015119742 A1 | 8/2015 |

OTHER PUBLICATIONS

Chiou, H-D et al., Effects of Oxyygen and Nitrogen on Slip in CZ Silicon Wafers, 1046B Extended Abstracts, 1984, Abstract No. 36, pp. 51-52, Pennington, New York.

Gamble, H.S. et al., Low-loss CPW Lines on Surface Stablized High-Resistivity Silicon, IEEE Microwave and Guided Wave Letters, Oct. 1999, pp. 395-397, vol. 9, No. 10.

Lederer, D. et al., Enhanced High resistivity SOI wafers for RF applications, 2004 IEEE International SOI Conference, Oct. 2004, pp. 46-47.

Ederer, D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR-SOI substrates using a layer transfer technique, 2006, IEEE International SOI Conference Proceedings, 2006, pp. 29-30.

Kerr, Daniel C., Identification of RF harmonic distortion of Si substrates and its reduction using a traprich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

(56) References Cited

OTHER PUBLICATIONS

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546, vol. 72, No. 20.

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Porrini, M. et al., Growth of Large Diameter High Purity Silicon Single Crystals With the MCZ Method For Power Devices Applications, MADEP< Symposium On Material And Devices For Powerelecronics, EPE European Conference On Power Electronics and Applications, Sep. 2, 1991, pp. 90-93.

Tong, Q. Y. et al., Semiconductor wafer bonding: recent developments, Materials Chemistry and Physics, Mar. 1994, pp. 101/127, vol. 37, No. 2, Elsevier Sequoia.

International Search Report and Written Opinion of the International Searching Authority regarding PCT/US2017/036061 dated Sep. 14, 2017; pp. 1-11.

\* cited by examiner

HIGH RESISTIVITY SINGLE CRYSTAL SILICON INGOT AND WAFER HAVING IMPROVED MECHANICAL STRENGTH

CROSS REFERENCE TO RELATED APPLICATION(S)

This application is a continuation of U.S. application Ser. No. 16/303,195, which was filed Nov. 20, 2018, U.S. Pat. No. 11,142,844, the disclosure of which is incorporated by reference as if set forth in its entirety. U.S. application Ser. No. 16/303,195 is a national stage application of International Application No. PCT/US2017/036061, filed Jun. 6, 2017, the disclosure of which is incorporated by reference as if set forth in its entirety. International Application No. PCT/US2017/036061 claims the benefit of U.S. provisional application Ser. No. 62/347,143, filed on Jun. 8, 2016, the disclosure of which is incorporated by reference as if set forth in its entirety. International Application No. PCT/US2017/036061 claims the benefit of U.S. provisional application Ser. No. 62/347,145, filed on Jun. 8, 2016, the disclosure of which is incorporated by reference as if set forth in its entirety.

FIELD OF THE INVENTION

This disclosure generally relates to the production of single crystal silicon ingots and wafers, the ingots and wafers having low oxygen concentration, high resistivity, and improved mechanical strength.

BACKGROUND OF THE INVENTION

Single crystal silicon is the starting material in many processes for fabricating semiconductor electronic components and solar materials. For example, semiconductor wafers produced from silicon ingots are commonly used in the production of integrated circuit chips. In the solar industry, single crystal silicon may be used instead of multicrystalline silicon due to the absence of grain boundaries and dislocations. Single crystal silicon ingots are machined into a desired shape, such as a silicon wafer, from which the semiconductor or solar wafers can be produced Existing methods to produce high-purity single crystal silicon ingot include a float zone method and a magnetic field applied Czochralski (MCZ) process. The float zone method includes melting a narrow region of a rod of ultrapure polycrystalline silicon and slowly translating the molten region along the rod to produce a single crystal silicon ingot of high purity. The MCZ process produces single crystal silicon ingots by melting polycrystalline silicon in a crucible, dipping a seed crystal into the molten silicon, and withdrawing the seed crystal in a manner sufficient to achieve the diameter desired for the ingot. A horizontal and/or vertical magnetic field may be applied to the molten silicon to inhibit the incorporation of impurities, such as oxygen, into the growing single crystal silicon ingot. Although float zone silicon ingots typically contain relatively low concentrations of impurities, such as oxygen, the diameter of ingots grown using the float zone method are typically no larger than about 200 mm due to limitations imposed by surface tension. MCZ silicon ingots may be produced at higher ingot diameters compared to float zone ingots, but MCZ silicon ingots typically contain higher concentrations of impurities.

During the process of producing single crystal silicon ingots using the MCZ method, oxygen is introduced into silicon crystal ingots through a melt-solid or melt crystal interface. The oxygen may cause various defects in wafers produced from the ingots, reducing the yield of semiconductor devices fabricated using the ingots. For example, insulated-gate bipolar transistors (IGBTs), high quality radio-frequency (RF), high resistivity silicon on insulator (HR-SOI), charge trap layer SOI (CTL-SOI), and substrate for GaN epitaxial applications typically require a low oxygen concentration (Oi) in order to achieve high resistivity.

At least some known semiconductor devices are fabricated using float zone silicon materials to achieve a low Oi and high resistivity. However, float zone materials are relatively expensive and are limited to use in producing ingots having a diameter less than approximately 200 mm. Accordingly, float zone silicon materials are expensive and unable to produce higher diameter silicon crystal ingots with a relatively low oxygen concentration.

High quality radio-frequency (RF) devices built on high resistivity silicon on insulator (HR-SOI) require very high resistivity for good second order harmonic performance (HD2). To maintain the high resistivity of the wafer during device fabrication and packaging, a very low Oi is required in order to minimize the thermal donor impact of Oi and to avoid formation of PN junctions. However, the mechanical strength of the low Oi wafer is severely degraded, and these wafers are prone to slip during high temperature process steps in SOI line, EPI reactor, and device fabrication steps. This causes a high yield loss both for SOI wafer manufacturers as well device manufacturer.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY OF THE INVENTION

In one embodiments, the present invention is directed to a single crystal silicon wafer comprising: two major, parallel surfaces, one of which is a front surface of the single crystal silicon wafer and the other of which is a back surface of the single crystal silicon wafer, a circumferential edge joining the front and back surfaces of the single crystal silicon wafer, a bulk region between the front and back surfaces, and a central plane of the single crystal silicon wafer between the front and back surfaces of the single crystal silicon wafer, wherein by the bulk region comprises an impurity comprising nitrogen at a concentration of at least about $1 \times 10^{14}$ atoms/cm$^3$, germanium at a concentration of at least about $1 \times 10^{19}$ atoms/cm$^3$, or a combination nitrogen at a concentration of at least about $1 \times 10^{14}$ atoms/cm$^3$ and germanium at a concentration of at least about $1 \times 10^{19}$ atoms/cm$^3$, and interstitial oxygen at a concentration of less than about 6 ppma (New ASTM: ASTM F 121, 1980-1983; DIN 50438/1, 1978), and further wherein the main body of the single crystal silicon ingot has a resistivity of at least about 1000 ohm cm.

In one embodiment, the present invention is further directed to a method of growing a single crystal silicon ingot. The method comprises preparing a silicon melt, wherein the silicon melt is prepared by melting polycrystalline silicon in a quartz lined crucible and adding a source of an impurity to the quartz lined crucible, the impurity comprising germanium, nitrogen, or a combination of germanium and nitrogen; and pulling the single crystal silicon ingot from the silicon melt, the single crystal silicon ingot comprising a central axis, a crown, an end opposite the crown, and a main body between the crown and the opposite end, the main body having a lateral surface and a radius, R, extending from the central axis to the lateral surface, wherein the main body of the single crystal silicon ingot comprises nitrogen at a concentration of at least about $1 \times 10^{14}$ atoms/cm$^3$, germanium at a concentration of at least about $1 \times 10^{19}$ atoms/cm$^3$, or a combination of nitrogen at a concentration of at least about $1 \times 10^{14}$ atoms/cm$^3$ and germanium at a concentration of at least about $1 \times 10^{19}$ atoms/cm$^3$, further wherein the pulling conditions are sufficient to yield a concentration of interstitial oxygen in the main body of the single crystal silicon ingot of less than about 6 ppma (New ASTM: ASTM F 121, 1980-1983; DIN 50438/1, 1978), and further wherein the main body of the single crystal silicon ingot has a resistivity of at least about 1000 ohm cm.

In one embodiment, the present invention is further directed to a single crystal silicon ingot comprising: a central axis, a crown, an end opposite the crown, and a main body between the crown and the opposite end, the main body having a lateral surface and a radius, R, extending from the central axis to the lateral surface, wherein the main body of the single crystal silicon ingot comprises an impurity comprising nitrogen at a concentration of at least about $1 \times 10^{14}$ atoms/cm$^3$, germanium at a concentration of at least about $1 \times 10^{19}$ atoms/cm$^3$, or a combination nitrogen at a concentration of at least about $1 \times 10^{14}$ atoms/cm$^3$ and germanium at a concentration of at least about $1 \times 10^{19}$ atoms/cm$^3$, and interstitial oxygen at a concentration of less than about 6 ppma (New ASTM: ASTM F 121, 1980-1983; DIN 50438/1, 1978), and further wherein the main body of the single crystal silicon ingot has a resistivity of at least about 1000 ohm cm.

Various refinements exist of the features noted in relation to the above-mentioned aspect. Further features may also be incorporated in the above-mentioned aspect as well. These refinements and additional features may exist individually or in any combination. For instance, various features discussed below in relation to any of the illustrated embodiments may be incorporated into the above-described aspect, alone or in any combination.

BRIEF DESCRIPTION OF THE DRAWINGS

Like reference symbols in the various drawings indicate like elements.

DETAILED DESCRIPTION OF THE EMBODIMENT(S) OF THE INVENTION

Figure 1:
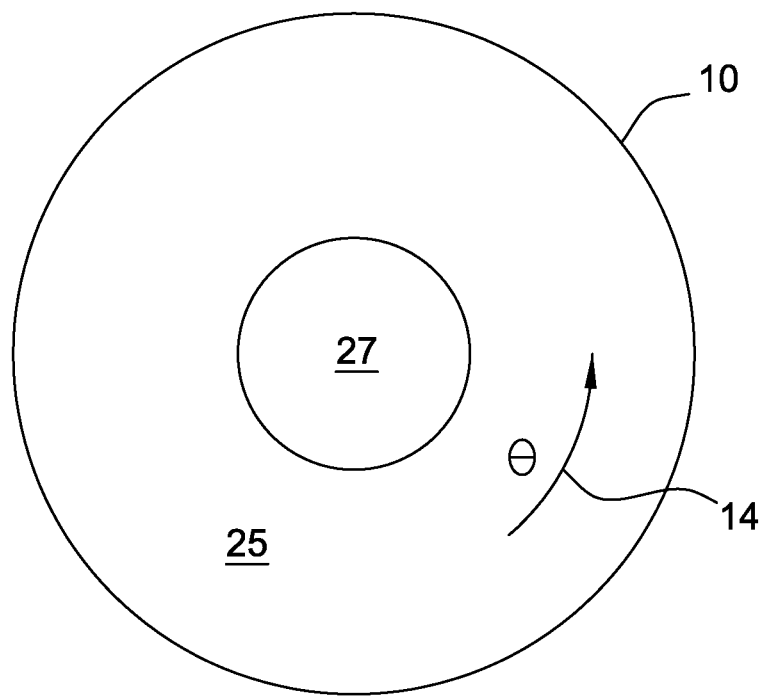
FIG. 1 is a top view of a crucible of one embodiment.

The method of the present invention is directed to the growth of single crystal silicon ingots under conditions sufficient to product ingots having low oxygen concentration, high resistivity, and improved mechanical strength. The present invention is further directed to single crystal silicon ingots produced by the method, and is still further directed to single crystal silicon wafers sliced from single crystal silicon ingots, the wafers having low oxygen concentration, high resistivity, and improved mechanical strength.

According to some embodiments of the present invention, the crystal growth conditions are sufficient to prepare a single crystal silicon ingot by the Czochralski method, the ingots comprising germanium (Ge) dopant at a concentration of at least about $1 \times 10^{19}$ atoms/cm$^3$ and having interstitial oxygen (Oi) at a concentration of less than about 6.0 ppma. According to some embodiments of the present invention, the crystal growth conditions are sufficient to prepare a single crystal silicon ingot by the Czochralski method, the ingots comprising nitrogen (N) dopant at a concentration of at least about $1 \times 10^{14}$ atoms/cm$^3$ and having interstitial oxygen (Oi) at a concentration of less than about 6.0 ppma. According to some embodiments of the present invention, the crystal growth conditions are sufficient to prepare a single crystal silicon ingot by the Czochralski method, the ingots comprising nitrogen (N) dopant at a concentration of at least about $1 \times 10^{14}$ atoms/cm$^3$ and germanium (Ge) dopant at a concentration of at least about $1 \times 10^{19}$ atoms/cm$^3$ and having interstitial oxygen (Oi) at a concentration of less than about 6.0 ppma. Further, the single crystal silicon ingots, and wafers sliced therefrom, have a resistivity of at least about 1000 ohm cm. In preferred embodiments, the ingots are pulled according to the Czochralski (Cz) batch crystal pulling process. Doping a single crystal silicon ingot with germanium advantageously improves the mechanical strength of the ingot, while also not impacting the resistivity of the Si. In some embodiments, nitrogen can be co-doped with Ge to improve mechanical strength without much impact on resistivity. The concentration of Ge and/or N dopant is low enough that the wafer is characterized by low or no thermal donor generation during a thermal process. Additionally, Ge doping does not degrade the second order harmonic performance, which can be degraded by other dopants, such as nitrogen, boron, or metals.

In some embodiments, resistivity may be controlled by selecting high purity polycrystalline silicon with >1000 ohm·cm resistivity and by preparing the melt in a high purity synthetic quartz lined crucible. In some embodiments, a compensating P/N type small quantity dilute dopant may be added to compensate for electrically active impurity to achieve desired resistivity of the crystal. Accordingly, the crystal pulling conditions and materials may be selected to provide a single crystal silicon ingot wherein the main body of the single crystal silicon ingot has a resistivity of at least about 1000 ohm cm, at least about 3000 ohm cm, at least about 4000 ohm cm, at least about 5000 ohm cm, at least about 10000 ohm cm, at least about 15000 ohm cm, or even at least about 20000 ohm cm.

In some embodiments, the interstitial oxygen, Oi, may be controlled to within a required range by puller process optimization. The methodology for manufacturing very low Oi single crystal silicon ingots may include combinations of three key process mechanisms. The three key mechanisms include 1) optimization of crucible inner wall temperature and crucible dissolution, 2) transport of Oi from crucible wall to the growing crystal, and 3) evaporation of SiO from the melt surface to gas phase. The three mechanisms stated above depend strongly on the melt flow conditions established and influenced heavily by the applied magnetic field. In some embodiments, the pulling conditions are sufficient to yield a concentration of interstitial oxygen in the main body of the single crystal silicon ingot of less than about 6 ppma, such as less than about 5 ppma, less than about 4 ppma, or even less than about 3 ppma. These concentrations are according to the New ASTM: ASTM F 121, 1980-1983; DIN 50438/1, 1978.

In some embodiments, germanium may be incorporated into the single crystal silicon ingot by adding a source of germanium, e.g., elemental germanium and/or silicon germanium, to the melt during meltdown process. Germanium is thereby incorporated in the single crystal silicon ingot based on segregation principle. Accordingly, in some embodiments, sufficient germanium, e.g., elemental germanium and/or silicon germanium, may be added to the silicon melt to thereby pull a single crystal silicon ingot wherein the main body of the single crystal silicon ingot comprises germanium at a concentration of at least about $1 \times 10^{19}$ atoms/cm$^3$, such as at least about $3 \times 10^{19}$ atoms/cm$^3$, or at least about $5 \times 10^{19}$ atoms/cm$^3$. The main body of the single crystal silicon ingot may comprise germanium at a concentration of less than about $1 \times 10^{22}$ atoms/cm$^3$, such as less than about $1 \times 10^{21}$ atoms/cm$^3$, or less than about $1 \times 10^{20}$ atoms/cm$^3$. In some embodiments, the main body of the single crystal silicon ingot comprises germanium at a concentration of at least about $1 \times 10^{19}$ atoms/cm$^3$ and less than about $1 \times 10^{22}$ atoms/cm$^3$. In some embodiments, the main body of the single crystal silicon ingot comprises germanium at a concentration of at least about $3 \times 10^{19}$ atoms/cm$^3$ and less than about $1 \times 10^{22}$ atoms/cm$^3$, such as between about $5 \times 10^{19}$ atoms/cm$^3$ and less than about $1 \times 10^{21}$ atoms/cm$^3$, or between about $5 \times 10^{19}$ atoms/cm$^3$ and less than about $1 \times 10^{20}$ atoms/cm$^3$.

In some embodiments, nitrogen may be incorporated into the single crystal silicon ingot by adding a source of nitrogen, e.g., silicon nitrogen or nitrogen gas, to the melt during meltdown process. Nitrogen is thereby incorporated in the single crystal silicon ingot based on segregation principle. In some embodiments, the main body of the single crystal silicon ingot comprises nitrogen at a concentration of at least about $1 \times 10^{14}$ atoms/cm$^3$, such as at least about $2 \times 10^{14}$ atoms/cm$^3$, or at least about $5 \times 10^{14}$ atoms/cm$^3$. In some embodiments, the main body of the single crystal silicon ingot comprises nitrogen at a concentration of at least about $1 \times 10^{14}$ atoms/cm$^3$ and less than about $1 \times 10^{16}$ atoms/cm$^3$. In some embodiments, the main body of the single crystal silicon ingot comprises nitrogen at a concentration between about $2 \times 10^{14}$ atoms/cm$^3$ and less than about $2 \times 10^{15}$ atoms/cm$^3$, such as at least about $5 \times 10^{14}$ atoms/cm$^3$ and less than about $1 \times 10^{16}$ atoms/cm$^3$. In some embodiments, the main body of the single crystal silicon ingot comprises nitrogen at a concentration of at least about $1 \times 10^{15}$ atoms/cm$^3$ and less than about $1 \times 10^{16}$ atoms/cm$^3$.

In some embodiments, germanium may be incorporated into the single crystal silicon ingot by adding a source of germanium, e.g., elemental germanium and/or silicon germanium, and nitrogen may be incorporated into the single crystal silicon ingot by adding a source of nitrogen, e.g., silicon nitrogen or nitrogen gas, to the melt during meltdown process. Accordingly, in some embodiments, sufficient germanium, e.g., elemental germanium and/or silicon germanium, may be added to the silicon melt to thereby pull a single crystal silicon ingot wherein the main body of the single crystal silicon ingot comprises germanium at a concentration of at least about $1 \times 10^{19}$ atoms/cm$^3$, such as at least about $3 \times 10^{19}$ atoms/cm$^3$, or at least about $5 \times 10^{19}$ atoms/cm$^3$, and the main body of the single crystal silicon ingot comprises nitrogen at a concentration of at least about $1 \times 10^{14}$ atoms/cm$^3$, such as at least about $2 \times 10^{14}$ atoms/cm$^3$, or at least about $5 \times 10^{14}$ atoms/cm$^3$. In some embodiments, the main body of the single crystal silicon ingot comprises germanium at a concentration of at least about $1 \times 10^{19}$ atoms/cm$^3$ and less than about $1 \times 10^{22}$ atoms/cm$^3$ and nitrogen at a concentration of at least about $1 \times 10^{14}$ atoms/cm$^3$ and less than about $1 \times 10^{16}$ atoms/cm$^3$. In some embodiments, the main body of the single crystal silicon ingot comprises germanium at a concentration of at least about $3 \times 10^{19}$ atoms/cm$^3$ and less than about $1 \times 10^{22}$ atoms/cm$^3$ and nitrogen at a concentration of at least about $2 \times 10^{14}$ atoms/cm$^3$ and less than about $1 \times 10^{15}$ atoms/cm$^3$.

Figure 2:
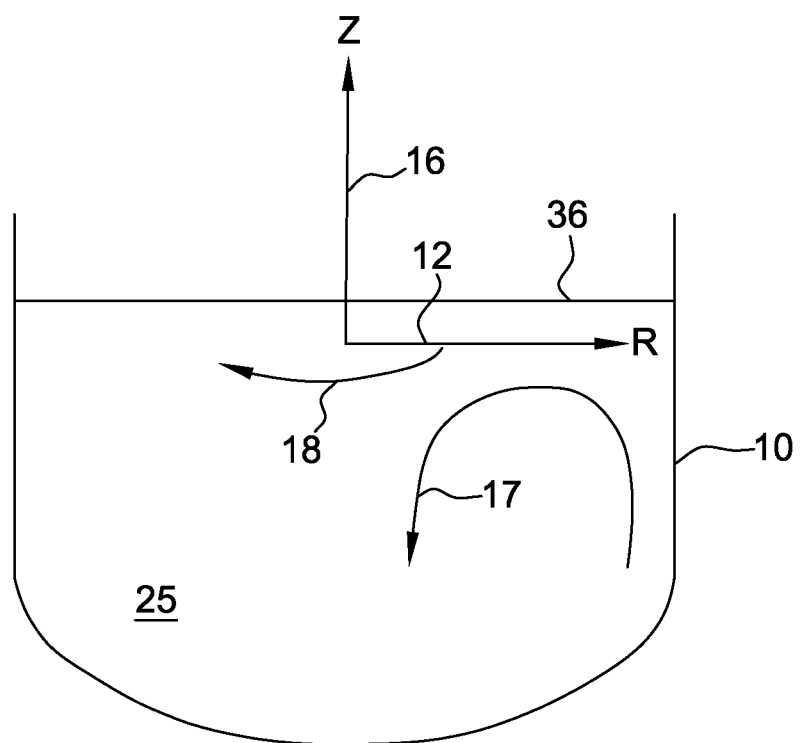
FIG. 2 is a side view of the crucible shown in FIG. 1.

With reference to FIGS. 1 and 2, a crucible of one embodiment is indicated generally at 10. A cylindrical coordinate system for crucible 10 includes a radial direction R 12, an angular direction θ 14, and an axial direction Z 16. Coordinates R 12, θ 14, and Z 16 are used herein to describe methods and systems for producing low oxygen silicon ingots. The crucible 10 contains a melt 25 having a melt surface 36. A crystal 27 is grown from the melt 25. The melt 25 may contain one or more convective flow cells 17, 18 induced by heating of the crucible 10 and rotation of the crucible 10 and/or crystal 27 in the angular direction θ 14. The structure and interaction of these one or more convective flow cells 17, 18 are modulated via regulation of one of more process parameters to reduce the inclusion of oxygen within the forming crystal 27 as described in detail herein below. The crucible wall 103 (see FIGS. 5A-5C and 8A-8C) may be lined with high purity quartz in order to enhance control of the resistivity. In some embodiments, the crucible 10 may be a synthetic crucible comprising a high purity quartz lining the crucible wall 103.

Figure 3:
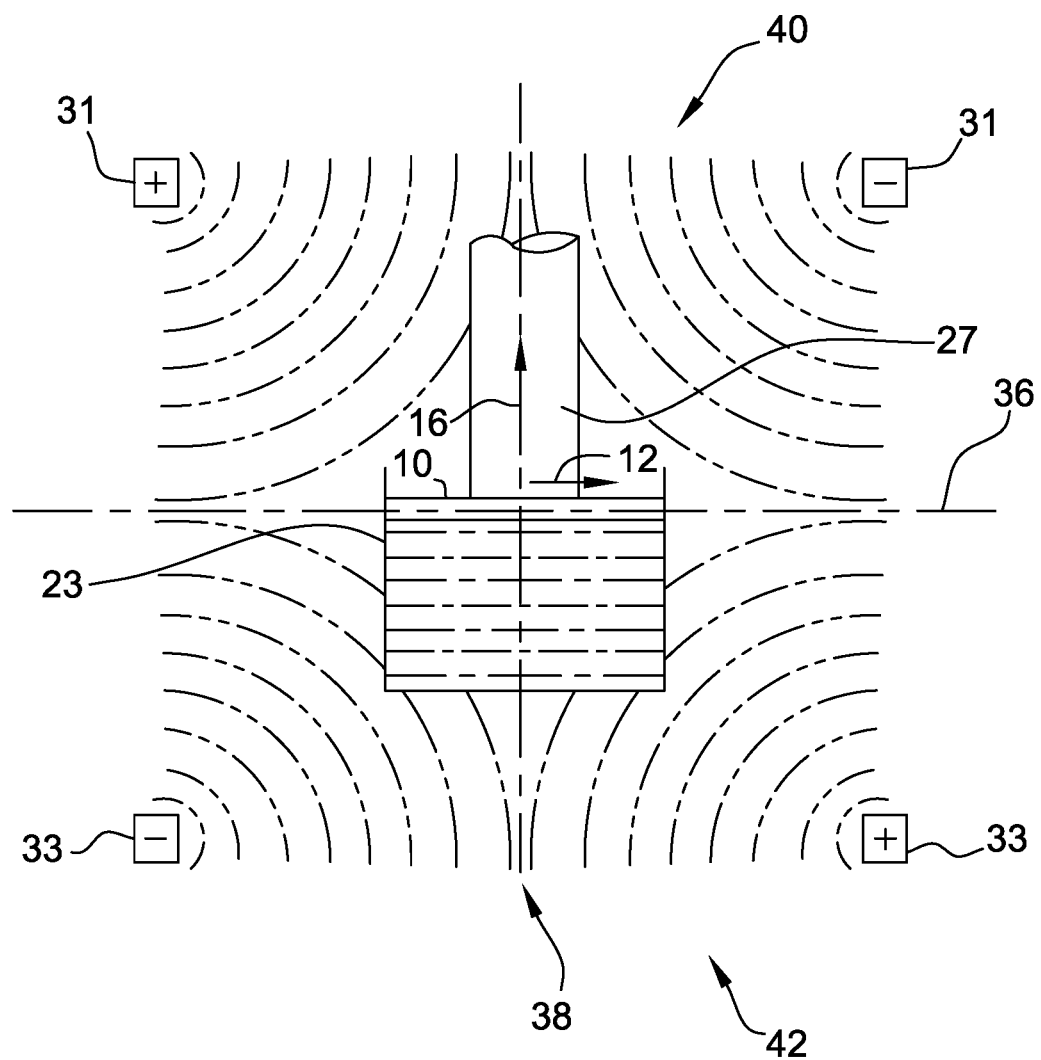
FIG. 3 is a schematic illustrating a cusped magnetic field applied to a crucible containing a melt in a crystal growing apparatus.

With Reference to FIG. 3, a block diagram illustrates a cusped magnetic field being applied to crucible 10 containing melt 23 in a crystal growing apparatus. As shown, crucible 10 contains silicon melt 23 from which a crystal 27 is grown. The cusped magnetic field configuration is designed to overcome deficiencies of axial and horizontal magnetic field configurations. A pair of coils 31 and 33 (e.g., Helmholtz coils) are placed coaxially above and below melt surface 36. Coils 31 and 33 are operated in an opposed current mode to generate a magnetic field that has a purely radial field component (i.e., along R 12) near melt surface 36 and a purely axial field component (i.e., along Z 16) near an axis of symmetry 38 of crystal 27. The combination of an upper magnetic field 40 and a lower magnetic field 42 produced by coils 31 and 33, respectively, results in axial and radial cusped magnetic field components.

Figure 4:
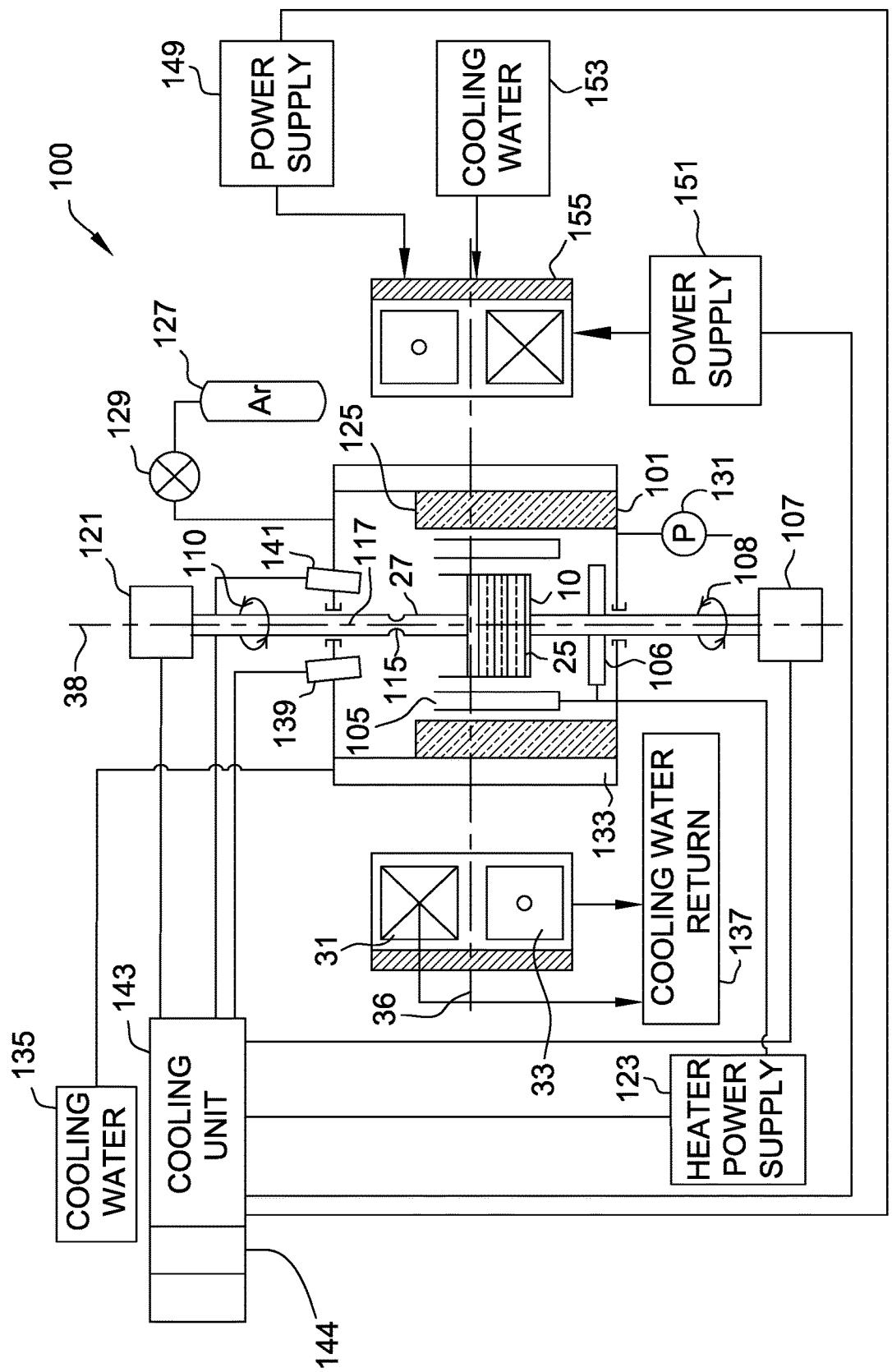
FIG. 4 is a block diagram of a crystal growing system of same embodiment as FIG. 1.

FIG. 4 is a block diagram of a crystal growing system 100. The crystal growing system 100, elements of the crystal growing system 100, and various operating parameters of the crystal growing system 100 are described in additional detail in International Application No. PCT/US2014/039164 (Published as WO 2014/190165), which is incorporated by reference herein in its entirety. Referring again to FIG. 4, system 100 employs a Czochralski crystal growth method to produce a semiconductor ingot. In this embodiment, system 100 is configured to produce a cylindrical semiconductor ingot having an ingot diameter of greater than one-hundred fifty millimeters (150 mm), more specifically in a range from approximately 150 mm to 460 mm, and even more specifically, a diameter of approximately three-hundred millimeters (300 mm). In other embodiments, system 100 is configured to produce a semiconductor ingot having a two-hundred millimeter (200 mm) ingot diameter or a four-hundred and fifty millimeter (450 mm) ingot diameter. In addition, in one embodiment, system 100 is configured to produce a semiconductor ingot with a total ingot length of at least five hundred millimeters (500 mm), such as at least 900 mm. In other embodiments, system 100 is configured to produce a semiconductor ingot with a total ingot length ranging from approximately five hundred millimeters (500 mm) to three thousands millimeters (3000 mm), such as between 900 mm and 1200 mm.

Referring again to FIG. 4, the crystal growing system 100 includes a vacuum chamber 101 enclosing crucible 10. A side heater 105, for example, a resistance heater, surrounds crucible 10. A bottom heater 106, for example, a resistance heater, is positioned below crucible 10. During heating and crystal pulling, a crucible drive unit 107 (e.g., a motor) rotates crucible 10, for example, in the clockwise direction as indicated by the arrow 108. Crucible drive unit 107 may also raise and/or lower crucible 10 as desired during the growth process. Within crucible 10 is silicon melt 25 having a melt level or melt surface 36. In operation, system 100 pulls a single crystal 27, starting with a seed crystal 115 attached to a pull shaft or cable 117, from melt 25. One end of pull shaft or cable 117 is connected by way of a pulley (not shown) to a drum (not shown), or any other suitable type of lifting mechanism, for example, a shaft, and the other end is connected to a chuck (not shown) that holds seed crystal 115 and crystal 27 grown from seed crystal 115.

Crucible 10 and single crystal 27 have a common axis of symmetry 38. Crucible drive unit 107 can raise crucible 10 along axis 38 as the melt 25 is depleted to maintain melt level 36 at a desired height. A crystal drive unit 121 similarly rotates pull shaft or cable 117 in a direction 110 opposite the direction in which crucible drive unit 107 rotates crucible 10 (e.g., counter-rotation). In embodiments using iso-rotation, crystal drive unit 121 may rotate pull shaft or cable 117 in the same direction in which crucible drive unit 107 rotates crucible 10 (e.g., in the clockwise direction). Iso-rotation may also be referred to as a co-rotation. In addition, crystal drive unit 121 raises and lowers crystal 27 relative to melt level 36 as desired during the growth process.

According to the Czochralski single crystal growth process, a quantity of polycrystalline silicon, or polysilicon, is charged to crucible 10. Additionally, the polycrystalline silicon charge comprises a source of germanium, which may be elemental germanium or silicon germanium, a source of nitrogen, which may be nitrogen gas or silicon nitride, or both a source of germanium and a source of nitrogen in order to dope the single crystal silicon ingot pulled from the melt. Suitable sources of germanium include elemental germanium and silicon germanium. In some embodiments, elemental, pure germanium is purified by a float zone process. The float zone purified Germanium is crushed into small chips/chunks and then used to dope the silicon melt. Silicon germanium may comprise germanium content in a molar ratio generally from about 0.1 to about 0.9. Accordingly, in some embodiments, sufficient Germanium, e.g., elemental germanium and/or silicon germanium, may be added to the silicon melt to thereby pull a single crystal silicon ingot wherein the main body of the single crystal silicon ingot comprises germanium at a concentration of at least about $1 \times 10^{19}$ atoms/cm$^3$, such as at least about $3 \times 10^{19}$ atoms/cm$^3$, or at least about $5 \times 10^{19}$ atoms/cm$^3$. The main body of the single crystal silicon ingot may comprise germanium at a concentration of less than about $1 \times 10^{22}$ atoms/cm$^3$, such as less than about $1 \times 10^{21}$ atoms/cm$^3$, or less than about $1 \times 10^{20}$ atoms/cm$^3$. Sufficient germanium is added to the silicon melt so that the resultant main body of the single crystal silicon ingot comprises germanium at a concentration of at least about $1 \times 10^{19}$ atoms/cm$^3$ and less than about $1 \times 10^{22}$ atoms/cm$^3$, such as at least about $3 \times 10^{19}$ atoms/cm$^3$, or between about $5 \times 10^{19}$ atoms/cm$^3$ and less than about $1 \times 10^{21}$ atoms/cm$^3$, or between about $5 \times 10^{19}$ atoms/cm$^3$ and less than about $1 \times 10^{20}$ atoms/cm$^3$.

In some embodiments, the polycrystalline silicon charge comprises a source of nitrogen, e.g., silicon nitride and/or nitrogen gas. In some embodiments, sufficient nitrogen may be added so that the main body of the single crystal silicon ingot comprises nitrogen at a concentration of at least about $1 \times 10^{14}$ atoms/cm$^3$ and less than about $1 \times 10^{16}$ atoms/cm$^3$. In some embodiments, the main body of the single crystal silicon ingot comprises nitrogen at a concentration between about $2 \times 10^{14}$ atoms/cm$^3$ and less than about $2 \times 10^{15}$ atoms/cm$^3$. In some embodiments, the main body of the single crystal silicon ingot comprises nitrogen at a concentration of at least about $5 \times 10^{14}$ atoms/cm$^3$ and less than about $1 \times 10^{16}$ atoms/cm$^3$. In some embodiments, the main body of the single crystal silicon ingot comprises nitrogen at a concentration of at least about $1 \times 10^{15}$ atoms/cm$^3$ and less than about $1 \times 10^{16}$ atoms/cm$^3$.

In some embodiments, the polycrystalline silicon charge comprises a source of germanium and a source of nitrogen. Accordingly, in some embodiments, sufficient germanium, e.g., elemental germanium and/or silicon germanium, may be added to the silicon melt to thereby pull a single crystal silicon ingot wherein the main body of the single crystal silicon ingot comprises germanium at a concentration of at least about $1 \times 10^{19}$ atoms/cm$^3$, such as at least about $3 \times 10^{19}$ atoms/cm$^3$, or at least about $5 \times 10^{19}$ atoms/cm$^3$, and sufficient nitrogen may be added to the silicon melt to thereby pull a single crystal silicon ingot comprising nitrogen at a concentration of at least about $1\times10^{14}$ atoms/cm$^3$, such as at least about $2\times10^{14}$ atoms/cm$^3$, or at least about $5\times10^{14}$ atoms/cm$^3$.

A heater power supply 123 energizes resistance heaters 105 and 106, and insulation 125 lines the inner wall of vacuum chamber 101. A gas supply 127 (e.g., a bottle) feeds argon gas to vacuum chamber 101 via a gas flow controller 129 as a vacuum pump 131 removes gas from vacuum chamber 101. An outer chamber 133, which is fed with cooling water from a reservoir 135, surrounds vacuum chamber 101.

The cooling water is then drained to a cooling water return manifold 137. Typically, a temperature sensor such as a photocell 139 (or pyrometer) measures the temperature of melt 25 at its surface, and a diameter transducer 141 measures a diameter of single crystal 27. In this embodiment, system 100 does not include an upper heater. The presence of an upper heater, or lack of an upper heater, alters cooling characteristics of crystal 27.

An upper magnet, such as solenoid coil 31, and a lower magnet, such as solenoid coil 33, are located above and below, respectively, melt level 36 in this embodiment. The coils 31 and 33, shown in cross-section, surround vacuum chamber (not shown) and share axes with axis of symmetry 38. In one embodiment, the upper and lower coils 31 and 33 have separate power supplies, including, but not limited to, an upper coil power supply 149 and a lower coil power supply 151, each of which is connected to and controlled by control unit 143.

In this embodiment, current flows in opposite directions in the two solenoid coils 31 and 33 to produce a magnetic field (as shown in FIG. 3). A reservoir 153 provides cooling water to the upper and lower coils 31 and 33 before draining via cooling water return manifold 137. A ferrous shield 155 surrounds coils 31 and 33 to reduce stray magnetic fields and to enhance the strength of the field produced.

A control unit 143 is used to regulate the plurality of process parameters including, but not limited to, at least one of crystal rotation rate, crucible rotation rate, and magnetic field strength. In various embodiments, the control unit 143 may include a processor 144 that processes the signals received from various sensors of the system 100 including, but not limited to, photocell 139 and diameter transducer 141, as well as to control one or more devices of system 100 including, but not limited to: crucible drive unit 107, crystal drive unit 121, heater power supply 123, vacuum pump 131, gas flow controller 129 (e.g., an argon flow controller), upper coil power supply 149, lower coil power supply 151, and any combination thereof.

In the example embodiment, system 100 produces single crystal silicon ingots suitable for use in device manufacturing. The single crystal silicon ingot is generally cylindrical and, due to pulling conditions, is capped with a conical crown and a conical end opposite the crown. Accordingly, a single crystal silicon ingot pulled according to the method of the present invention comprises a central axis, a crown, an end opposite the crown, and a main body between the crown and the opposite end, the main body having a lateral surface and a radius, R, extending from the central axis to the lateral surface. Advantageously, system 100 may be used to produce single crystal silicon ingot 27, a substantial portion or all of which is substantially free of agglomerated intrinsic point defects. Furthermore, system 100 may be used to produce single crystal silicon ingot 27 having substantially no agglomerated defects that are larger than approximately one hundred twenty nanometers (nm) in diameter, or more particularly, approximately ninety nm in diameter. The shape of the melt-solid or melt-crystal interface and the pull speed is controlled during crystal growth to limit and/or suppress the formation of agglomerated intrinsic point defects.

During production, oxygen is introduced into single crystal silicon ingots through the melt-solid or melt crystal interface. However, oxygen may cause various defects in wafers produced from the ingots, reducing the yield of semiconductor devices. Accordingly, it is desirable to produce silicon crystal ingots with a low oxygen concentration. Using the methods described herein, single crystal silicon ingots are produced having an oxygen concentration less than approximately 6 ppma, or less than approximately 5 ppma, or less than approximately 4 ppma less than approximately 3 ppma. These concentrations are according to the New ASTM: ASTM F 121, 1980-1983; DIN 50438/1, 1978.

Without being limited to any particular theory, oxygen is introduced into the growing silicon crystal ingot emerging from the melt by an interacting series of events, each of which is influenced by at least one process parameter as described herein below. SiO is introduced into the melt via dissolution at the crucible wall. The SiO introduced at the crucible wall may be moved elsewhere in the melt via flow induced by buoyancy forces created by localized heating of the melt neat the crucible wall. The SiO may be further moved by additional flow induced by the rotation rate of the crystal at the melt-crystal interface as well as rotation rate of the crucible itself. The concentration of SiO in the melt may be reduced via evaporation from the melt at the exposed surface of the melt. The interaction of any combination of dissolution, convection, and evaporation of SiO within the melt influences the concentration of SiO in the melt situated near the crystal-melt interface that is formed into the silicon crystal ingot. In various aspects, any one or more process parameters are simultaneously regulated to reduce the concentration of SiO situated near the melt-crystal interface, and consequently reduce the oxygen concentration within the silicon crystal ingot formed according to the method.

In various embodiments, various process parameters are regulated simultaneously to facilitate producing silicon crystal ingots with a low oxygen concentration. In one embodiment, the various process parameters are regulated in at least two stages that include an intermediate body growth stage corresponding to growth of the silicon crystal ingot up to an intermediate ingot lengths of approximately 800 mm, and a late body growth stage corresponding to growth of the silicon crystal ingot from an intermediate ingot length of approximately 800 mm up to the total ingot length. In this embodiment, the regulation of the various process parameters in at least two different stages accounts for changes in the nature of the interaction of dissolution, convection, evaporation of SiO within the melt, depth of the melt in the crucible, and the flow cells within the melt in the crucible as the silicon crystal ingot grows in length.

In particular, the role of convection is modified over the formation of the entire silicon crystal ingot due to a decrease in the depth of the melt within the crucible associated with growth of the silicon crystal ingot, as described in detail below. As a result, at the late body growth stage, the regulation of at least one process parameter is modified differently relative to the regulation of these same parameters at the intermediate body growth stage. In some embodiments, at the late body growth stage, the regulation of at least three process parameters is modified differently relative to the regulation of these same parameters at the intermediate body growth stage. As described herein below, the regulation of the process parameters modulate various factors related to the convection of SiO within the melt at the late body growth stage. In one embodiment, the process parameters with modified regulation during the late body growth stage include, but are not limited to: seed rotation rate, crucible rotation rate, and magnetic field strength.

Referring again to FIG. 4, seed rotation rate refers to the rate at which pull shaft or cable 117 rotates seed crystal 115 about axis 38. Seed rotation rate impacts the flow of SiO from crucible 10 to crystal 27 and a rate of SiO evaporation from melt 25. Referring again to FIG. 2, the flow of SiO from crucible 10 to crystal 27 is influenced generally by interactions between crystal flow cell 18 driven by the rotation of crystal 27 at the seed rotation rate within melt 25 and buoyancy flow cell 17 driven by heating of melt 25 within crucible 10. The impact of seed rotation rate on the flow of SiO from crucible 10 to crystal 27 differs depending on the stage of growth of crystal 27.

Figure 5A:
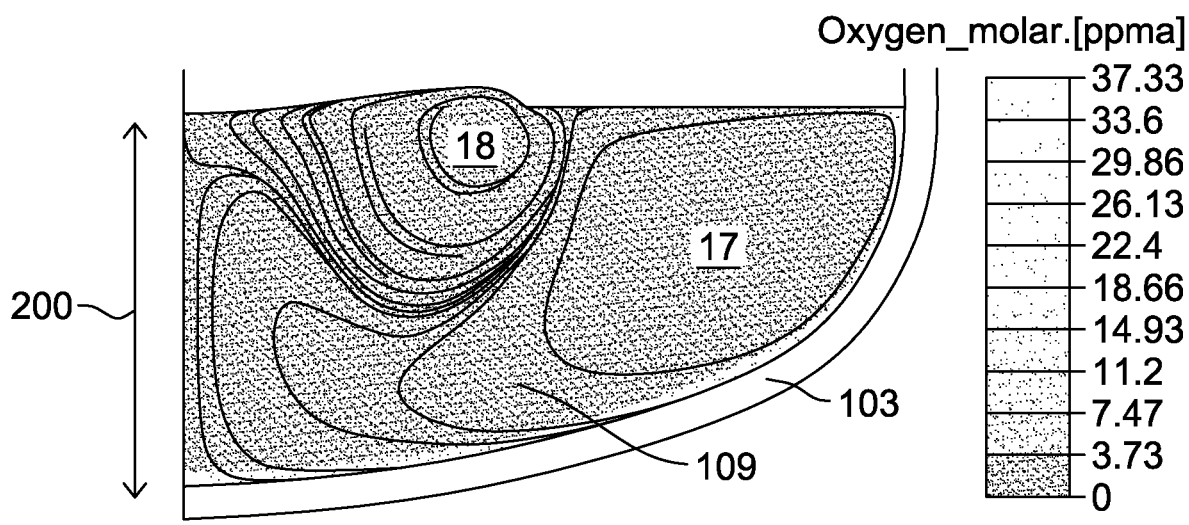
FIG. 5A is a cross-sectional view of a portion of a crucible showing flowlines and oxygen concentration near the crucible wall at intermediate body growth at a given crystal rotation rate.

FIG. 5A is a cross-sectional view of simulated flowlines 109 and oxygen concentrations within melt 25 (with reference to FIG. 2) at an intermediate body growth stage, corresponding to growth of crystal 27 (with reference to FIG. 1) up to an intermediate ingot length of approximately 800 mm. At the intermediate body growth stage, depth 200 of melt 25 within crucible 10 is sufficiently deep to effectively decouple interactions between fluid motion induced by crystal flow cell 18 and buoyancy flow cell 17. A high seed rotation rate (i.e. 12 rpm) reduces the boundary layer thickness between melt line 36 and the gas above melt 25 to increase SiO evaporation. Further, a high seed rotation rate decreases melt flow from crucible 10 to crystal 27 by suppressing buoyancy flow cell 17 with induced crystal flow cell 18, as illustrated in FIG. 5A. Moreover, a high seed rotation rate creates an outward radial flow that retards the inward flow (i.e., transport) of SiO from crucible 10, reducing the oxygen concentration in crystal 27.

Figure 5B:
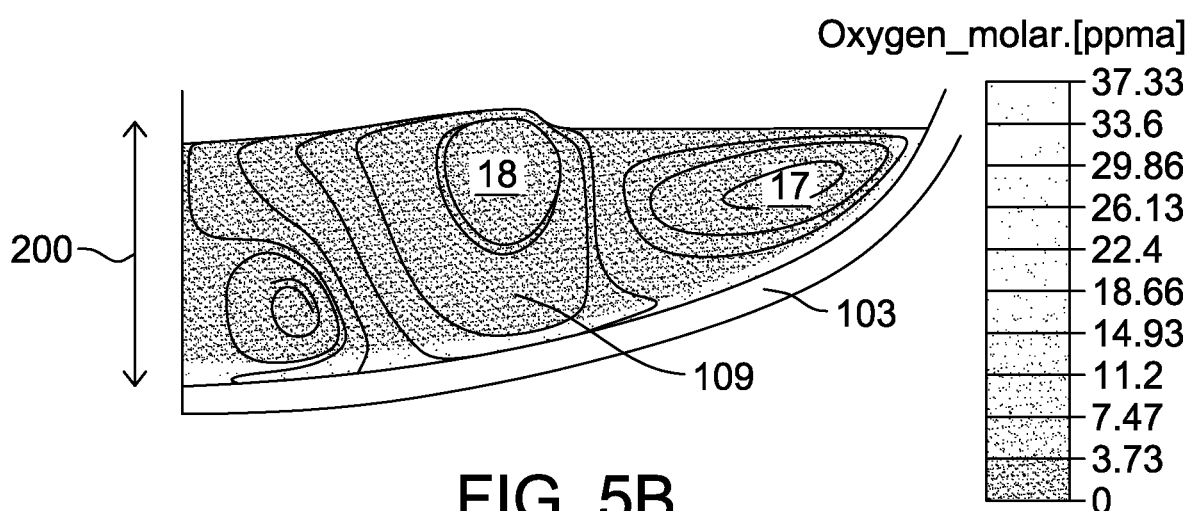
FIG. 5B is a cross-sectional view of a portion of an example crucible mapping flowlines and oxygen concentration near the crucible wall at late body growth at a crystal rotation rate.

FIG. 5B is a cross-sectional view of simulated flowlines 109 and oxygen concentrations within melt 25 at a late body growth stage, corresponding to growth of crystal 27 from an intermediate ingot length of approximately 800 mm up to the total ingot length. Due to removal of melt 25 from crucible 10 associated with formation of crystal 27, depth 200 at the late body growth stage is shallower with respect to depth 200 at intermediate body growth stage as illustrated in FIG. 5A. At a similarly high seed rotation rate to that used to perform the simulation illustrated in FIG. 5A (i.e. 12 rpm), crystal flow cell 18 contacts the inner wall of crucible 10, causing convection of SiO formed at the inner wall of crucible 10 into crystal 27 formed at the late body growth stage.

Figure 5C:
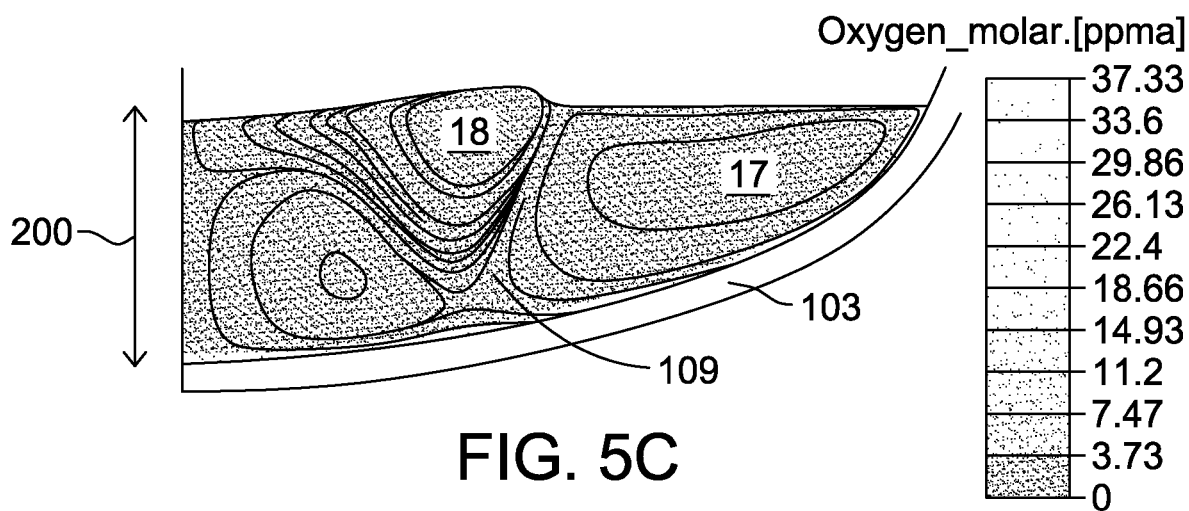
FIG. 5C is a cross-sectional view of a portion of a crucible mapping flowlines and oxygen concentration near the crucible wall at late body growth at a different crystal rotation rate.

FIG. 5C is a cross-sectional view of simulated flowlines 109 and oxygen concentrations within melt 25 at a late body growth stage calculated at a lower (e.g., 8 rpm) seed rotation rate. Crystal flow cell 18 induced by the lower seed rotation rate does not extend to the inner wall of crucible 10, but instead is excluded by buoyancy cell 17. As a result, the flow of SiO produced at the inner wall of crucible 10 to crystal 27 is disrupted, thereby reducing the oxygen concentration within crystal 27 formed at the late body growth stage at reduced seed rotation rate.

As described herein, the transition from an intermediate to a late body growth stage is a soft transition. The transition may vary depending on various parameters of the process, such as crucible size, shape, depth of melt, modeling parameters, and the like. Generally, at the intermediate body growth stage, parameters are such that there are limited or no interactions between fluid motion induced by crystal flow cell 18 and buoyancy flow cell 17; the crystal flow cell 18 and buoyancy flow cell 17 are effectively decoupled. At the late body growth stage, parameters are such that there are interactions between fluid motion induced by crystal flow cell 18 and buoyancy flow cell 17; the crystal flow cell 18 and buoyancy flow cell 17 are effectively coupled. By way of non-limiting example, late body growth stage occurs when less than about 37% of the initial mass of melt 25 is left in crucible 10 in an embodiment that includes an initial melt mass between 180 kg to 450 kg in a crucible 10 with an inner diameter of about 36 inches. In various embodiments, depth 200 of melt 25 within crucible 10 is monitored to identify the transition from the intermediate to a late body growth stage. In other examples, the late body growth stage occurs when less than about 35%, less than about 40%, less than about 45%, or less than about 50% of the initial mass of melt 25 is left in crucible 10. In some embodiments, the transition from intermediate to late body growth stage is determined based on the depth of melt 25, or any other suitable parameter.

In various embodiments, the method includes regulating the seed rotation rate in at least two stages including, but not limited to, the intermediate body growth stage and the late body growth stage. In one embodiment, the method includes rotating crystal 27 during the intermediate body growth stage at a seed rotation rate ranging from approximately 8 to 14 rpm, and more specifically 12 rpm. In this embodiment, the method further includes reducing the seed rotation rate at the late body growth stage to a seed rotation rate ranging from approximately 6 rpm to 8 rpm, and more specifically 8 rpm.

Figure 6:
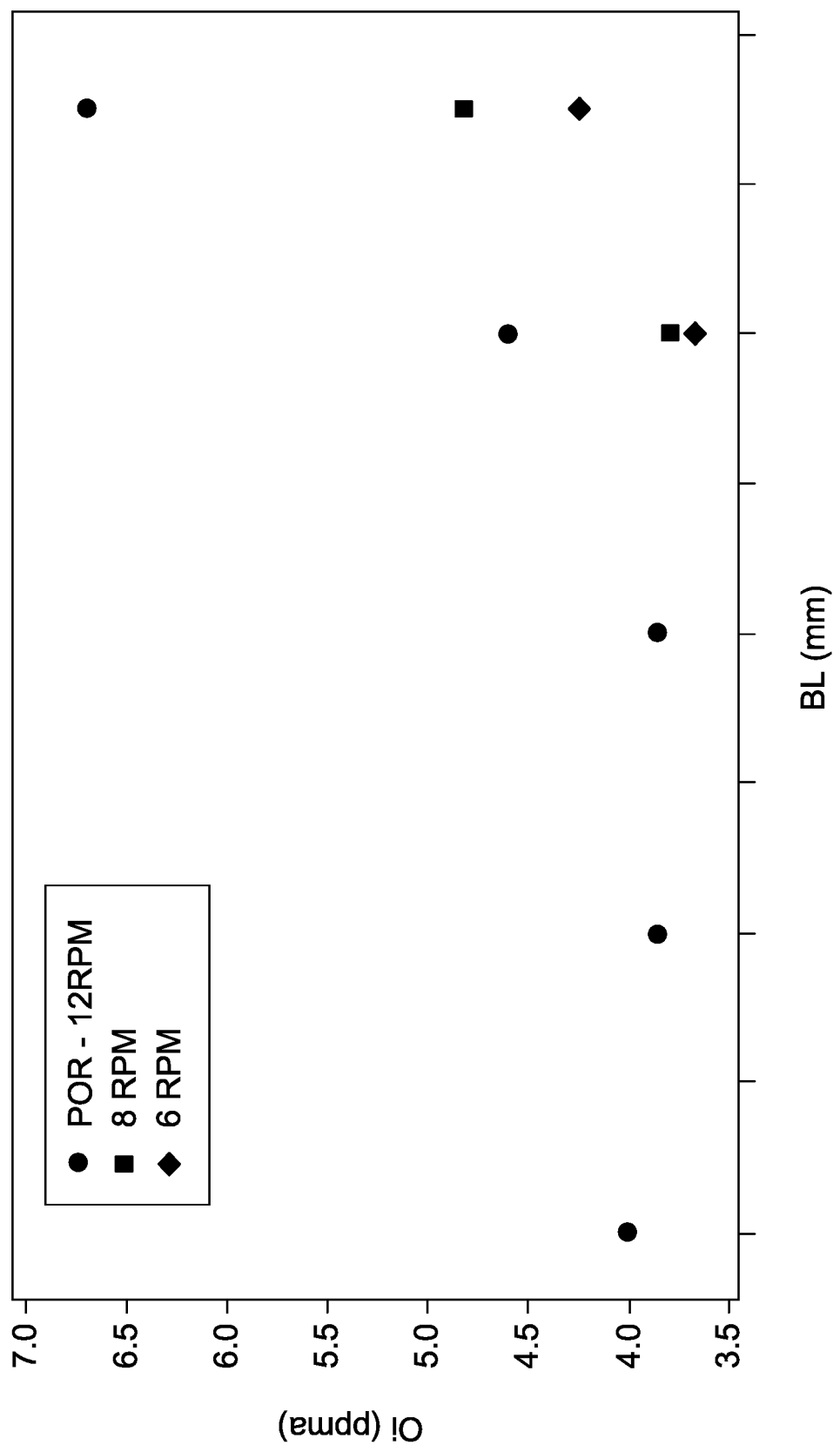
FIG. 6 is a graph plotting a simulated oxygen concentration (Oi) as a function of crystal rotation rate at late body growth versus position (BL) along the crystal.
Figure 9:
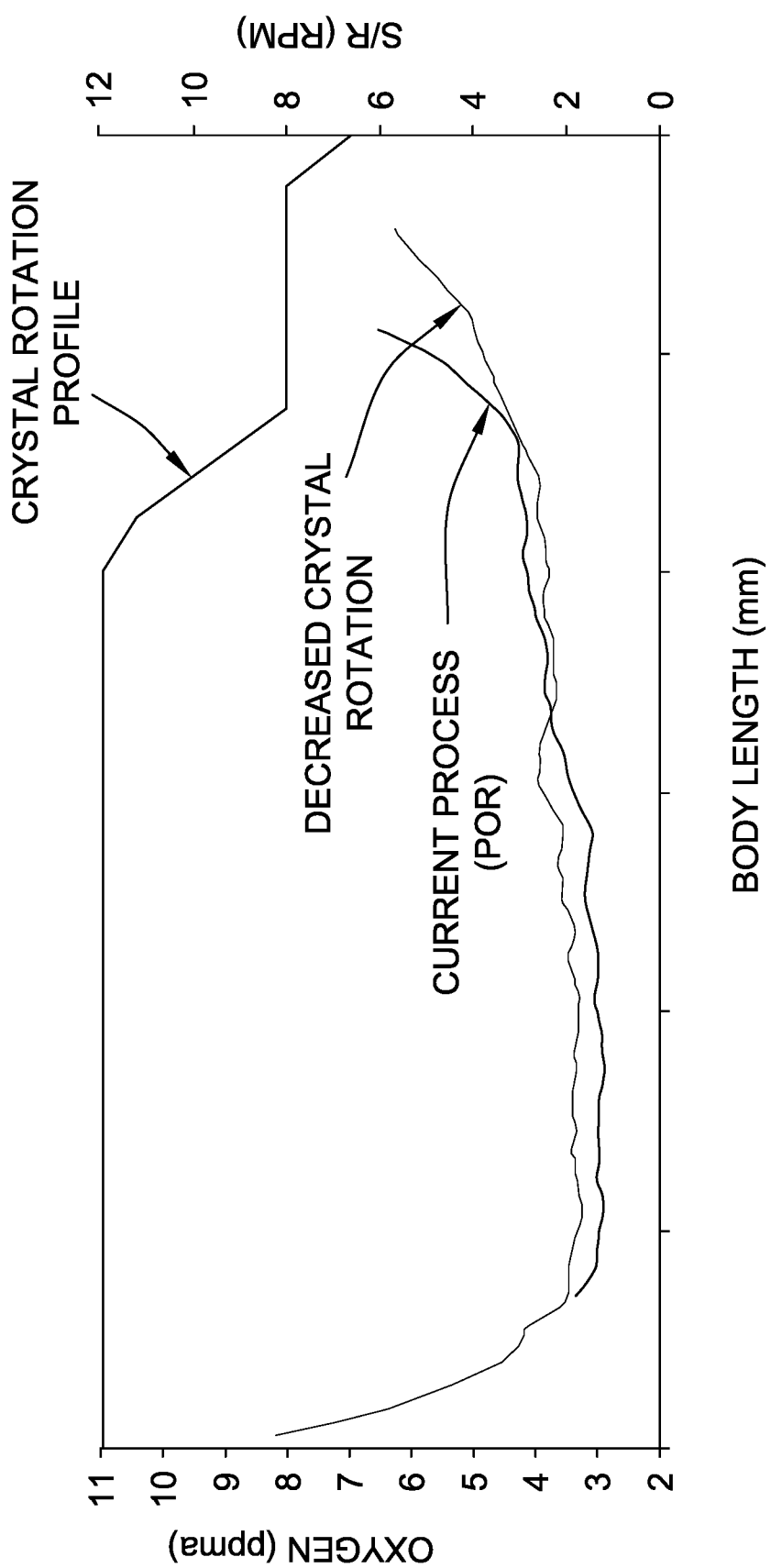
FIG. 9 is a graph plotting oxygen concentration as a function of crystal body length for two different crystal rotation rate profiles.

In another embodiment, the seed rotation rate may be reduced according to the intermediate ingot length. By way of non-limiting example, the seed rotation rate may be regulated to approximately 12 rpm for intermediate ingot lengths up to approximately 850 mm, and may be further regulated to linearly decrease to approximately 8 rpm at an intermediate ingot length of approximately 950 mm, and then regulate seed rotation rate at approximately 8 rpm up to the total ingot length, as illustrated in FIG. 9. As also illustrated in FIG. 9, the oxygen content of the crystal within the body length ranging from approximately 800 mm to the total ingot length is reduced compared to a crystal formed at a constant seed rotation rate of approximately 12 rpm. FIG. 6 is a graph comparing the simulated oxygen concentration of crystals formed at seed rotation rates according to three rotation schedules: a) rotation at 12 rpm for the formation of the entire crystal; b) rotation at 12 rpm up to an intermediate crystal length of 900 mm followed by rotation at 8 rpm for formation of the remaining crystal length; and c) rotation at 12 rpm up to an intermediate crystal length of 900 mm followed by rotation at 6 rpm for formation of the remaining crystal length. As illustrated in FIG. 6, lower seed rotation rates reduced oxygen concentration within the portion of the crystal formed at the late body growth stage.

Crucible rotation rate may further influence the oxygen concentrations within crystals 27 formed according to embodiments of the method. Crucible rotation rate refers to the rate at which crucible 10 is rotated about axis 38 using crucible drive unit 107. Crucible rotation rate impacts the flow of SiO from crucible 10 to crystal 27 and an amount of SiO evaporating from melt 25. A high crucible rotation rate reduces both a boundary layer thickness between crucible 10 and melt 25, and a boundary layer thickness between melt line 36 and the gas above melt 25. However, to minimize the oxygen concentration in crystal 27, a thicker boundary layer between crucible 10 and melt 25 is desired to reduce the SiO transport rate, while a thinner boundary layer between melt line 36 and the gas above melt 25 is desired to increase the SiO evaporation rate. Accordingly, the crucible rotation rate is selected to balance the competing interests of a high boundary layer thickness between crucible 10 and melt 25 resulting from slower crucible rotation rates and a low boundary layer thickness between melt line 36 and the gas above melt 25 resulting from higher crucible rotation rates.

Changes in depth 200 of melt 10 between intermediate body growth stage and late body growth stage described herein above influence the impact of modulation of crucible rotation rate on oxygen concentration in a manner similar to the influence of seed rotation rate described herein previously. In various embodiments, the method includes regulating the crucible rotation rate in at least two stages including, but not limited to, the intermediate body growth stage and the late body growth stage. In one embodiment, the method includes rotating crucible 10 at the intermediate body growth stage at a crucible rotation rate ranging from approximately 1.3 rpm to approximately 2.2, and more specifically 1.7 rpm. In this embodiment, the method further includes reducing the crucible rotation rate at the late body growth stage to a crucible rotation rate ranging from approximately 0.5 rpm to approximately 1.0 rpm, and more specifically 1 rpm.

Figure 7A:
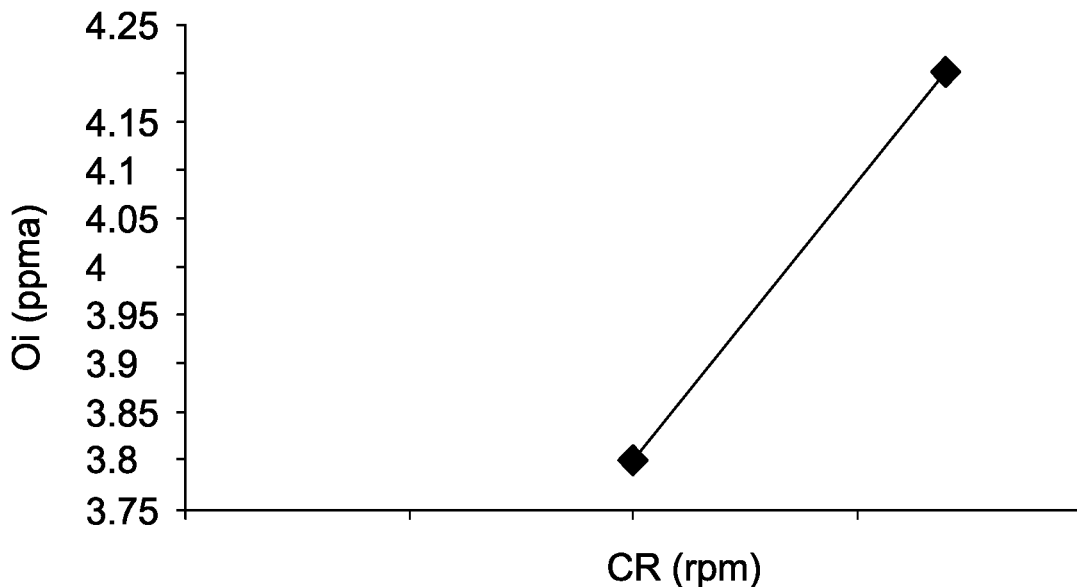
FIG. 7A is a graph plotting an oxygen concentration at late body growth versus crucible rotation rate for a crystal body rotation rate of 6 rpm.
Figure 7B:
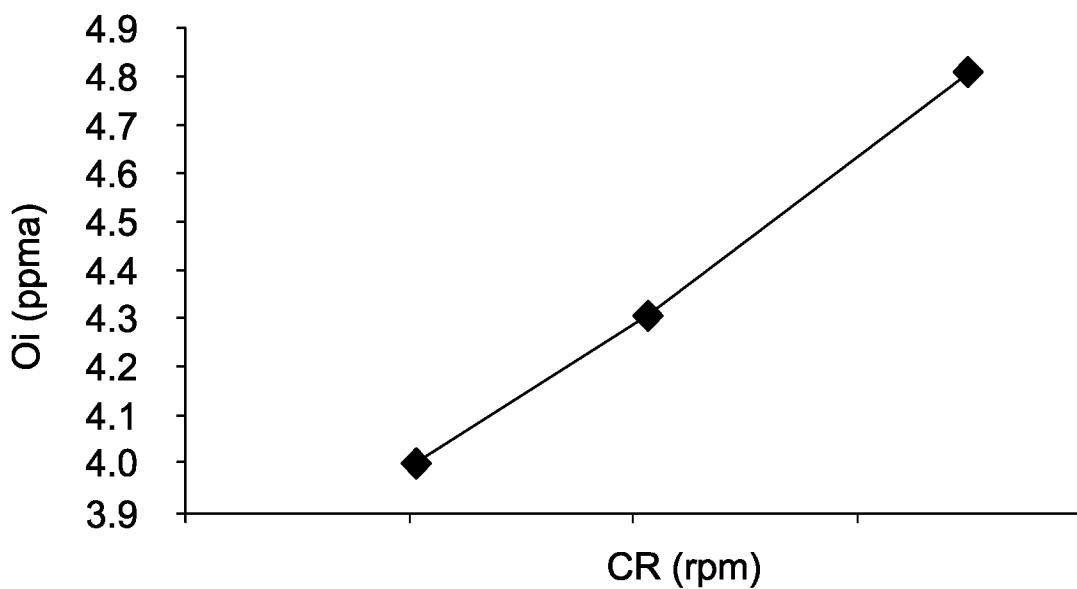
FIG. 7B is a graph plotting an oxygen concentration at late body growth versus crucible rotation rate for a crystal body rotation rate of 8 rpm.

FIGS. 7A and 7B are graphs showing a simulated oxygen concentration within silicon ingots as a function of the crucible rotation rate at late body growth stage. The silicon ingots of FIG. 7A were formed using an embodiment of the method in which the seed rotation rate was reduced from 12 rpm to 6 rpm at late body growth stage, and the crucible rotation rate was reduced from about 1.7 rpm to 1 rpm or 1.5 rpm at late body growth stage. The silicon ingots of FIG. 7B were formed using an embodiment of the method in which the seed rotation rate was reduced from 12 rpm to 8 rpm at late body growth stage, and the crucible rotation rate was reduced from about 1.7 rpm to 0.5 rpm, 1 rpm, or 1.5 rpm at late body growth stage. In both simulations, lower crucible rotation rates were associated with lower oxygen concentrations within the resulting silicon ingot.

The method may further include regulating magnet strength in at least two stages including, but not limited to, the intermediate body growth stage and the late body growth stage. Magnet strength refers to the strength of the cusped magnetic field within the vacuum chamber. More specifically, magnet strength is characterized by a current through coils 31 and 33 that is controlled to regulate magnetic strength. Magnetic strength impacts the flow of SiO from crucible 10 to crystal 27. That is, a high magnetic strength minimizes the flow of SiO from crucible 10 to crystal 27 by suppressing a buoyancy force within melt 25. As the magnetic field suppresses the buoyancy flow, it decreases the dissolution rate of the quartz crucible, thus lowering the interstitial oxygen incorporated into the crystal. However, if the magnetic field strength increases beyond a certain level, further retardation in the buoyancy flow may result in decreasing the evaporation rate at the melt free surface, thus raising the interstitial oxygen levels. Due to differences in the relative contribution of buoyancy flow to the oxygen content of the crystal at the late body formation stage relative to the intermediate body formation stage as described previously herein, an adjustment to the magnet strength at the late body formation stage enables appropriate modulation of buoyancy flow to reduce oxygen within the crystal formed at the late body formation stage.

In various embodiments, the method includes regulating the magnetic field strength in at least two stages including, but not limited to, the intermediate body growth stage and the late body growth stage. In one embodiment, the method includes regulating the magnetic field strength at the intermediate body growth stage such that the magnetic field strength is approximately 0.02 to 0.05 Tesla (T) at an edge of crystal 27 at the melt-solid interface and approximately 0.05 to 0.12 T at the wall of crucible 10. In another aspect, the method includes regulating the magnetic field strength at the late body growth stage such that the magnetic field strength is approximately 150% of the magnetic field strength used during the intermediate body growth stage, corresponding to approximately 0.03 to 0.075 Tesla (T) at an edge of crystal 27 at the melt-solid interface and approximately 0.075 to 0.18 T at the wall of crucible 10.

Figure 8A:
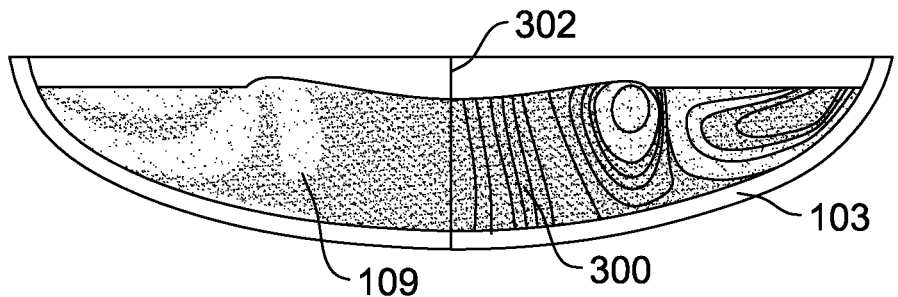
FIG. 8A is a cross-sectional view of an example crucible mapping flowlines and velocity magnitudes near a crucible wall at late body growth at a magnetic field strength corresponding to 50% balanced.
Figure 8A:
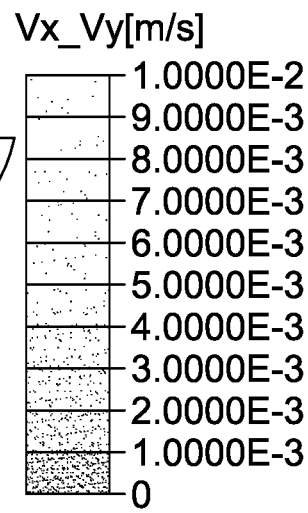
Figure 8B:
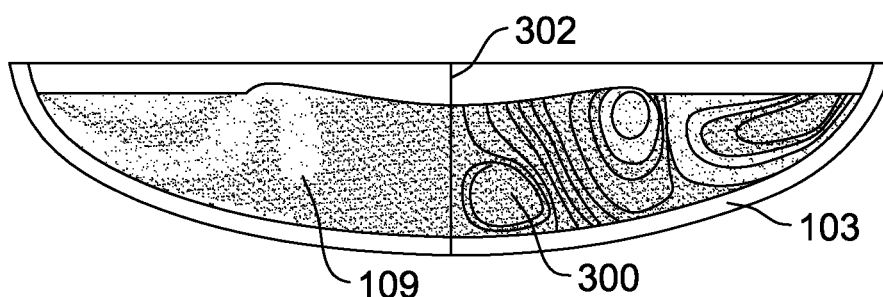
FIG. 8B is a cross-sectional view of an example crucible mapping flowlines and velocity magnitudes near a crucible wall at late body growth at a magnetic field strength corresponding to 95% balanced.
Figure 8B:
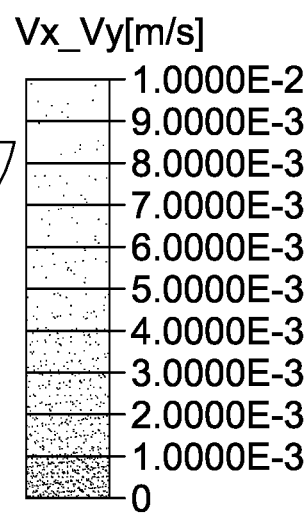
Figure 8C:
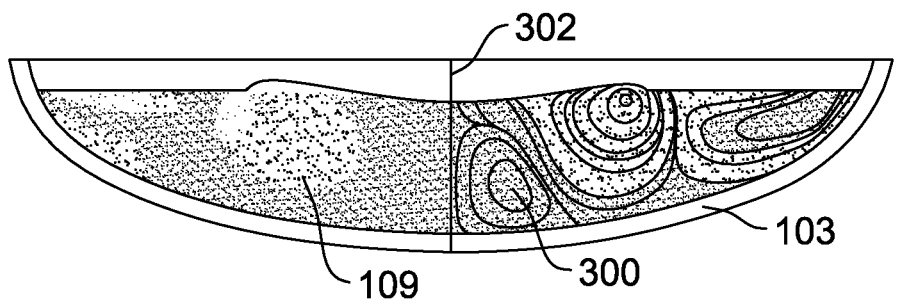
FIG. 8C is a cross-sectional view of an example crucible mapping flowlines and velocity magnitudes near a crucible wall at late body growth at a magnetic field strength corresponding to 150% balanced.
Figure 8C:
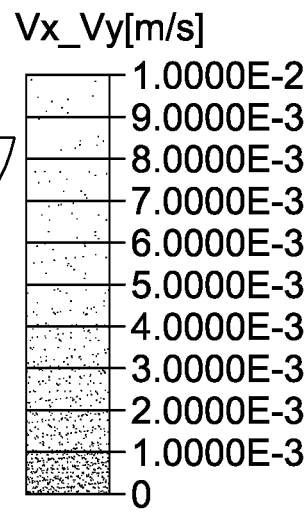

FIGS. 8A, 8B, and 8C are cross-sectional views of simulated flowlines 109 and total speeds within melt 25 at a late body growth stage. FIG. 8A was simulated using magnetic field strengths corresponding to 50% of the magnetic field used at intermediate body growth stage (i.e. approximately 0.01 to 0.025 Tesla (T) at an edge of crystal 27 at the melt-solid interface and approximately 0.025 to 0.06 T at the wall of crucible 10). FIG. 8B was simulated using magnetic field strengths corresponding to 95% of the magnetic field used at intermediate body growth stage approximately 0.019 to 0.0475 Tesla (T) at an edge of crystal 27 at the melt-solid interface and approximately 0.0475 to 0.114 T at the wall of crucible 10. FIG. 8C was simulated using magnetic field strengths corresponding to 150% of the magnetic field used at intermediate body growth stage (i.e. approximately 0.03 to 0.075 Tesla (T) at an edge of crystal 27 at the melt-solid interface and approximately 0.075 to 0.18 T at the wall of crucible 10). Comparing FIGS. 8A, 8B, and 8C, as the strength of the magnetic field increases, flow 300 from the bottom of crucible 10 to melt-crystal interface 302 transitions from relatively high convection to melt-crystal interface 302 at low magnetic field strength (FIG. 8A) to a relatively little convection at higher magnetic field strengths. This suppression of buoyancy flow within melt 25 by the increased magnetic field results in lower oxygen concentration in the resulting silicon ingot, as summarized in Table 1 below. At 150% magnetic field strength, the simulated oxygen concentration was within the desired range below 5 parts per million atoms (ppma).

TABLE 1

Effect of Magnetic Field Strength at Late Body Growth Stage on Oxygen Concentration in Silicon Ingots

| Magnetic Field Strength (% intermediate body growth stage field strength) | Simulated Oxygen Concentration (ppma) |
| --- | --- |
| 50% | 9.3 |
| 95% | 6.4 |
| 150% | 4.5 |

One or more additional process parameters may be regulated to facilitate producing silicon crystal ingots with a low oxygen concentration. However, the effects of these additional process parameters are not sensitive to the changes in the depth 200 of melt 25 within crucible 10 during growth of crystal 27. Consequently, the regulation of the additional process parameters described herein remains essentially the same between different stages of crystal growth, as described in additional detail below.

One additional process parameter that is controlled, at least in some embodiments, is wall temperature of crucible 10. The wall temperature of crucible 10 corresponds to a dissolution rate of crucible 10. Specifically, the higher the wall temperature of crucible 10, the faster that portions of crucible 10 will react with and dissolve into melt 25, generating SiO into the melt and potentially increasing an oxygen concentration of crystal 27 via the melt-crystal interface. Accordingly, reducing the wall temperature of crucible 10, as used herein, equates to reducing the dissolution rate of crucible 10. By reducing the wall temperature of crucible 10 (i.e., reducing the dissolution rate of crucible 10), the oxygen concentration of crystal 27 can be reduced. Wall temperature may be regulated by controlling one or more additional process parameters including, but not limited to heater power and melt to reflector gap.

Heater power is another process parameter that may be controlled in some embodiments to regulate the wall temperature of crucible 10. Heater power refers to the power of side and bottom heaters 105 and 106. Specifically, relative to typical heating configurations, by increasing a power of side heater 105 and reducing a power of bottom heater 106, a hot spot on the wall of crucible 10 is raised close to the melt line 36. As the wall temperature of crucible 10 at or below melt line 36 is lower, the amount of SiO generated by melt 25 reacting with crucible 10 is also lower. The heater power configuration also impacts melt flow by reducing the flow (i.e., transport) of SiO from crucible 10 to single crystal 27. In this embodiment, a power of bottom heater 106 is approximately 0 to 5 kilowatts, and more specifically approximately 0 kilowatts, and a power of side heater 105 is in a range from approximately 100 to 125 kilowatts. Variations in the power of side heater 105 may be due to, for example, variation in a hot zone age from puller to puller.

In some embodiments, melt to reflector gap is an additional process parameter that is controlled to regulate the wall temperature of crucible 10. Melt to reflector gap refers to a gap between melt line 36 and a heat reflector (not shown). Melt to reflector gap impacts the wall temperature of crucible 10. Specifically, a larger melt to reflector gap reduces the wall temperature of crucible 10. In this embodiment, the melt to reflector gap is between approximately 60 mm and 80 mm, and more specifically 70 mm.

Seed lift is an additional process parameter that is controlled to regulate the flow of SiO from crucible 10 to crystal 27. Seed lift refers to the rate at which pull shaft or cable 117 lifts seed crystal 115 out of melt 25. In one embodiment, seed crystal 115 is lifted at a rate between about 0.4 mm/min and about 0.7 mm/min, for example, in a range of approximately 0.42 to 0.55 millimeters per minute (mm/min), and more specifically 0.46 mm/min for 300 mm product. This pull rate is slower than pull rates typically used for smaller diameter (e.g., 200 mm) crystals. For example, the seed lift for 200 mm product may between about 0.55 mm/min and about 0.95 mm/min, such as in a range of approximately 0.55 to 0.85 mm/min, and more specifically 0.7 mm/min.

Pull speed is an additional process parameter that may be regulated to control the defect quality of the crystal. For example, using SP2 laser light scattering, the detected agglomerated point defects generated by the process described herein may be less than 400 counts for defects less than 60 nm, less than 100 counts for defects between 60 and 90 nm, and less than 100 counts for less defects between 90 and 120 nm.

In some embodiments, inert gas flow is an additional process parameter that is controlled to regulate the SiO evaporation from melt 25. Inert gas flow, as described herein, refers to the rate at which argon gas flows through vacuum chamber 101. Increasing the argon gas flow rate sweeps more SiO gas above melt line 36 away from crystal 27, minimizing a SiO gas partial pressure, and in turn increasing SiO evaporation. In this embodiment, the argon gas flow rate is in a range from approximately 100 slpm to 150 slpm.

Inert gas pressure is an additional process parameter also controlled to regulate the SiO evaporation from melt 27 in some embodiments. Inert gas pressure, as described herein, refers to the pressure of the argon gas flowing through vacuum chamber 101. Decreasing the argon gas pressure increases SiO evaporation and hence decreases SiO concentration in melt 25. In this embodiment, the argon gas pressure ranges from approximately 10 torr to 30 torr.

In suitable embodiments, cusp position is an additional process parameter that is controlled to regulate the wall temperature of crucible 10 and the flow of SiO from crucible 10 to crystal 27. Cusp position, as described herein, refers to the position of the cusp of the magnetic field generated by coils 31 and 33. Maintaining the cusp position below melt line 36 facilitates reducing the oxygen concentration. In this embodiment, the cusp position is set in a range from approximately 10 mm to 40 mm below melt line 36, more specifically, in a range of approximately 25 mm to 35 mm below melt line 36, and even more specifically, at approximately 30 mm.

By controlling process parameters (i.e., heater power, crucible rotation rate, magnet strength, seed lift, melt to reflector gap, inert gas flow, inert gas pressure, seed rotation rate, and cusp position) as described above, a plurality of process parameters (i.e., a wall temperature of a crucible, a flow of SiO from the crucible to a single crystal, and an evaporation of SiO from a melt) are regulated to produce single crystal silicon ingots having a low oxygen concentration. In one embodiment, the methods described herein facilitate producing a silicon ingot with an ingot diameter greater than approximately 150 millimeters (mm), a total ingot length of at least approximately 900 mm, and an oxygen concentration less than 6 ppma, such as less than about 5 ppma, less than about 4 ppma, or even less than about 3 ppma. In another embodiment, the methods described herein facilitate producing a silicon ingot with an ingot diameter ranging from approximately 150 mm to 460 mm, specifically approximately 300 mm, and an oxygen concentration less than 6 ppma, such as less than about 5 ppma, less than about 4 ppma, or even less than about 3 ppma. In another additional embodiment, the methods described herein facilitate producing a silicon ingot with a total ingot length ranging from approximately 900 mm to 1200 mm, and an oxygen concentration less than 6 ppma, such as less than about 5 ppma, less than about 4 ppma, or even less than about 3 ppma. These concentrations are according to the New ASTM: ASTM F 121, 1980-1983; DIN 50438/1, 1978.

A single crystal silicon wafer may be sliced according to conventional techniques from a single crystal silicon ingot or slug prepared according to the method of the present invention. In general, a single crystal silicon wafer comprises two major, parallel surfaces, one of which is a front surface of the single crystal silicon wafer and the other of which is a back surface of the single crystal silicon wafer, a circumferential edge joining the front and back surfaces of the single crystal silicon wafer, a bulk region between the front and back surfaces, and a central plane of the single crystal silicon wafer between the front and back surfaces of the single crystal silicon wafer. Wafers then undergo conventional processing. Accordingly, any sharp, fragile edges are rounded or "profiled" to provide strength and stability to the wafer. This will ultimately prevent chipping or breakage in subsequent processing. Next, each wafer is laser-marked with very small alphanumeric or bar code characters. This laser-mark ID gives full trace-ability to the specific date, machine, and facility where the wafers were manufactured. The wafers are then loaded into a precision "lapping" machine that uses pressure from rotating plates and an abrasive slurry to ensure a more uniform, simultaneous removal of saw damage present on both front and backside surfaces. This step also provides stock removal and promotes flatness uniformity. Now the wafers must go through an "etching" cycle. Chemical etching is necessary for the removal of residual surface damage caused by lapping; it also provides some stock removal. During the etching cycle, wafers progress down another series of chemical baths and rinse tanks with precise fluid dynamics. These chemical solutions produce a flatter, stronger wafer with a glossy finish. All wafers are then sampled for mechanical parameters and for process feedback.

Single crystal silicon wafers having low oxygen concentration (i.e., less than about 6 ppma, less than about 5 ppma, less than about 4 ppma, or even less than about 3 ppma) using the systems and methods described herein may be advantageous in a variety of applications. For example, insulated-gate bipolar transistors (IGBTs), high quality radio-frequency (RF), high resistivity silicon on insulator (HR-SOI), charge trap layer SOI (CTL-SOI), and substrate for GaN EPI applications may benefit from the low oxygen concentration because they achieve high resistivity and do not have p-n junctions. In some embodiments, the resistivity of a single crystal silicon wafer is at least about 3000 ohm cm, such as at least about 4000 ohm cm, at least about 5000 ohm cm, at least about 10000 ohm cm, such as at least about 15000 ohm cm, or even at least about 20000 ohm cm. Wafers produced for IGBT applications using the methods described herein may, for example, have 30 to 300 ohm-centimeter (ohm-cm) N-type resistivity or greater than 750 ohm-cm N/P-type resistivity. Further, wafers produced for radiofrequency (RF), high resistivity silicon on insulator (HR-SOI), charge trapping layer SOI (CTL-SOI). and/or GaN EPI applications using the methods described herein may have, for example, greater than 750 ohm-cm P-type wafers, or at least about 3000 ohm cm, such as at least about 4000 ohm cm, at least about 5000 ohm cm, at least about 10000 ohm cm, such as at least about 15000 ohm cm, or even at least about 20000 ohm cm. Wafers produced by the described systems and methods may also be used as handle wafers. For P-type wafers produced using the methods described herein, boron, aluminum, gallium, and/or indium may be suitably used has a majority carrier, and red phosphorus, phosphorus, arsenic, and/or antimony may be used as a minority carrier. For N-type wafers produced using the methods described herein, red phosphorus, phosphorus, arsenic, and/or antimony may be used as the majority carrier, and boron, aluminum, gallium, and/or indium may be used as the minority carrier.

To improve mechanical strength and slip performance, wafers produced using the methods described are co-doped (e.g., by doping the single crystal that forms the ingot) with germanium and/or nitrogen. Germanium may be incorporated into the single crystal silicon ingot by adding a source of germanium, e.g., elemental germanium and/or silicon germanium, to the melt during meltdown process. Germanium is thereby incorporated in the solid crystal form based on segregation principle. Accordingly, in some embodiments, single crystal silicon wafers sliced from ingots pulled according to the method of the present invention comprise germanium at a concentration of at least about $1\times10^{19}$ atoms/cm$^3$, such as at least about $3\times10^{19}$ atoms/cm$^3$, or at least about $5\times10^{19}$ atoms/cm$^3$. The single crystal silicon wafers sliced from ingots pulled according to the method of the present invention may comprise germanium at a concentration of less than about $1\times10^{22}$ atoms/cm$^3$, such as less than about $1\times10^{21}$ atoms/cm$^3$, or less than about $1\times10^{20}$ atoms/cm$^3$. In some embodiments, the single crystal silicon wafers comprise germanium at a concentration of at least about $1\times10^{19}$ atoms/cm$^3$ and less than about $1\times10^{22}$ atoms/cm$^3$. In some embodiments, the single crystal silicon wafers comprise germanium at a concentration of at least about $5\times10^{19}$ atoms/cm$^3$ and less than about $1\times10^{22}$ atoms/cm$^3$. Single crystal silicon wafers sliced from the main body portion of the single crystal silicon ingots comprises germanium within these concentration ranges.

In some embodiments, nitrogen may be incorporated into the single crystal silicon ingot by adding a source of nitrogen, e.g., silicon nitrogen or nitrogen gas, to the melt during meltdown process. In addition to improving mechanical strength, nitrogen dopant may interact with Oi in order to partially alter the electrical property of the wafers by forming thermal donors. This electrical property may be a function of temperature, as the generation and killing temperature of such species are different for each individual species. The thermal donor generated by O—O, N—O, Ge—O have different thermal stability. For example, N—O thermal donor is found to be generated around 600° C. and may be stable up <900° C. Thus to dissociate the N—O thermal donor, a >900° C. thermal donor kill (TDK) step may be required to control the resistivity of the wafers. Alternatively, in absence of such TDK process step, the doping of the crystal may be adjusted to compensate for the resistivity shift by TD, to achieve target resistivity. In some embodiments, the single crystal silicon ingot is co-doped with germanium and nitrogen. In some embodiments, the main body of the single crystal silicon ingot comprises germanium at a concentration of at least about $1\times10^{19}$ atoms/cm$^3$, at least about $3\times10^{19}$ atoms/cm$^3$, such as at least about $5\times10^{19}$ atoms/cm$^3$ and nitrogen at a concentration of at least about $1\times10^{14}$ atoms/cm$^3$. In some embodiments, the main body of the single crystal silicon ingot comprises germanium at a concentration of at least about $1\times10^{19}$ atoms/cm$^3$ and less than about $1\times10^{22}$ atoms/cm$^3$ and nitrogen at a concentration of at least about $1\times10^{14}$ atoms/cm$^3$ and less than about $1\times10^{16}$ atoms/cm$^3$. In some embodiments, the main body of the single crystal silicon ingot comprises nitrogen at a concentration of at least about $5\times10^{14}$ atoms/cm$^3$ and less than about $1\times10^{16}$ atoms/cm$^3$. In some embodiments, the main body of the single crystal silicon ingot comprises nitrogen at a concentration of at least about $2\times10^{14}$ atoms/cm$^3$ and less than about $1\times10^{15}$ atoms/cm$^3$. In some embodiments, the main body of the single crystal silicon ingot comprises germanium at a concentration of at least about $3\times10^{19}$ atoms/cm$^3$ and less than about $1\times10^{22}$ atoms/cm$^3$ and nitrogen at a concentration of at least about $1\times10^{15}$ atoms/cm$^3$ and less than about $1\times10^{16}$ atoms/cm$^3$. Single crystal silicon wafers sliced from the main body portion of the single crystal silicon ingots comprise germanium and nitrogen within these concentration ranges.

Example systems and methods of producing single crystal silicon ingots with relatively low oxygen concentration from a melt formed from polycrystalline silicon are described herein. These methods take advantage of changes in the structure of flow cells in the melt between a first and second stage of production of the ingot to produce relatively low oxygen silicon. During the first stage, the silicon ingot is relatively small and the depth of the melt is relatively deep. The second stage is characterized by a depleted melt depth within the crucible due to formation of the silicon ingot. In this second stage, a flow cell induced by rotation of the silicon ingot within the melt may contact the bottom of the crucible, causing unwanted inclusion of silicon oxide formed at the crucible bottom into the growing crystal ingot. The methods and systems described herein control production of the ingot to limit the including of the unwanted silicon oxide. Generally, at least one process parameter is changed during the second stage relative to its value during the first stage. Non-limiting examples of changes in process parameters from the first stage to the second stage include: reduced crystal rotation rate, reduced crucible rotation rate, increased magnetic field strength, and any combination thereof. For example, in some embodiments, the silicon ingot is rotated more slowly during the second stage to reduce contact of the rotation induced flow cell with the bottom of the crucible, and thereby reduce the amount oxygen included in the silicon ingot.

The systems and methods described herein enable the formation of single crystal silicon ingots with low oxygen concentration maintained over a longer ingot length than was achieved using previous methods. A detailed description of the effects of these changes in process parameters on the structure of flow cells within the crucible and the oxygen content of the silicon ingots formed using the method on various embodiments, are described in further detail herein.

Embodiments of the methods described herein achieve superior results compared to prior methods and systems. For example, the methods described herein facilitate producing silicon ingots with a lower oxygen concentration than at least some known methods. Further, unlike at least some known methods, the methods described herein may be used for the production of ingots having a diameter greater than 150 mm, such as about 300 mm.

Additionally, incorporation of germanium impurity and/or nitrogen impurity, into the low oxygen content, high resistivity wafers improves mechanical strength in wafers normally suffering from degraded mechanical strength and susceptible to wafer slip during high temperature operations. The fracture strength of germanium doped low oxygen wafers may be improved both as grown and post anneal. Another advantage of germanium doping is lowered thermal donor formation, thereby reducing the free carrier concentration and enabling higher resistivity wafers. Still further, germanium doping in single crystal silicon ingots and wafers can effectively suppress void defects. The Germanium dopant atoms combine with vacancies, thereby suppressing vacancy aggregation necessary to form voids. An additional effect of vacancy combination is strain relaxation originating from the mismatch of Ge atoms in silicon crystal lattice. The reduction of free vacancies leads to suppression of grown-in voids and decreases the formation temperature and thus the size of voids, leading to poorer thermal stability of voids. In addition, germanium doping in single crystal silicon ingots and wafers improves the formation of denuded zone (DZ, i.e. a region of low or no oxygen precipitation) in the near surface region can be achieved under one-step high temperature annealing, as a result of germanium enhancing oxygen precipitation in the bulk region and the out-diffusion of oxygen in the near surface region.

In addition, both N and Ge doping in Si crystals can effectively suppress void defects and reduce the concentration of free vacancies significantly (J. Cry. Growth 243 (2002) 371-374). Thus during crystal growth, it can be pulled faster for the same defect concentration compared to conventional processes, thus improving throughput of the process. This is particularly helpful for a charge trap layer SOI application (CTL-SOI), where, a poly-silicon based charge trap layer is added between high resistivity low oxygen handle and P type donor wafer. Due to the presence of poly-silicon layer, high density of crystal defect (COP) may be allowed on the handle wafers without disruption of the process flow during device manufacturing (in particular during LLS inspection).

Wafers sliced from ingots prepared according to the method of the present invention are suitable for use as a handle wafer and/or a donor wafer in the manufacture of silicon on insulator structures. Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer. The donor can recycled for multiple uses as SOI donor wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. As a handle wafer, wafers prepared according to the method of the present invention are particularly suitable for high resistivity SOI structures for use in RF devices. An HR-SOI structure may comprise a high resistivity handle wafer having a low oxygen concentration, high resistivity, and be doped with germanium for improved mechanical strength. Accordingly, some embodiments of the present invention are directed to an HR-SOI structure comprising a Ge-doped handle wafer, a dielectric layer (generally, a buried silicon oxide layer or BOX), and a device layer.

Such a substrate is prone to formation of high conductivity charge inversion or accumulation layers at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, one of the method of creating a semiconductor-on-insulator (e.g., a silicon-on-insulator, or SOI) with a CTL for RF device applications is based on depositing an undoped polycrystalline silicon film on a silicon substrate having high resistivity and then forming a stack of oxide and top silicon layer on it. A polycrystalline silicon layer acts as a high defectivity layer between the silicon substrate and the buried oxide layer. An alternative method is the implantation of heavy ions to create a near surface damage layer. Devices, such as radiofrequency devices, are built in the top silicon layer.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf.*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghae and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

In some embodiments, the high resistivity, low oxygen, germanium doped wafers are suitable substrates for epitaxial deposition. The epitaxial deposition preferably is carried out by chemical vapor deposition. Generally speaking, chemical vapor deposition involves exposing the surface of the wafer to an atmosphere comprising silicon in an epitaxial deposition reactor, e.g., a Centura reactor available from Applied Materials. Preferably, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (preferably $H_2$). For example, the source of silicon during the epitaxial deposition may be $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is ramped to and maintained at a temperature sufficient to prevent the atmosphere comprising silicon from depositing polycrystalline silicon on the surface. Generally, the temperature of the surface during this period preferably is at least about 900° C. More preferably, the temperature of the surface is maintained in the range of between about 1050 and about 1150° C. Most preferably, the temperature of the surface is maintained at the silicon oxide removal temperature.

The rate of growth of the epitaxial deposition preferably is from about 0.5 to about 7.0 μm/min. A rate of about 3.5 to about 4.0 μm/min may be achieved, for example, by using an atmosphere consisting essentially of about 2.5 mole % $SiHCl_3$ and about 97.5 mole % $H_2$ at a temperature of about 1150° C. and an absolute pressure of up to about 1 atm.

In some applications, the wafers comprise an epitaxial layer which imparts electrical properties. In some embodiments, the epitaxial layer is lightly doped with phosphorous. Therefore, the ambient for epitaxial deposition comprises phosphorous present as a volatile compound, such as, for example, phosphine, $PH_3$. In some embodiments, the epitaxial layer can contain boron. Such a layer may be prepared by, for example, including $B_2H_6$ in the atmosphere during the deposition.

A deposited epitaxial layer may comprise substantially the same electrical characteristics as the underlying wafer. Alternatively, the epitaxial layer may comprise different electrical characteristics as the underlying wafer. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise a dopant selected from the group consisting of boron, arsenic, and phosphorus. The resistivity of the epitaxial layer may range from 1 to 50 Ohm-cm, typically, from 5 to 25 Ohm-cm. In some embodiments, the epitaxial layer may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

In some embodiments, the high resistivity, low oxygen, germanium doped wafers are suitable substrates for gallium nitride epitaxial deposition, such as by molecular beam epitaxy. GaN molecular beam epitaxy (MBE) growth is a non-equilibrium process where a Ga vapor beam from an effusion cell and an activated nitrogen beam from a plasma source are directed toward a heated substrate. Under suitable conditions, layer-by-layer deposition of Ga and N atomic planes is possible. The MBE procedure is performed in an ultra-high vacuum chamber, minimizing film contamination.

The following non-limiting Examples are provided to further illustrate the present invention.

EXAMPLES

Example 1. Crystal Growth

A germanium doped single crystal silicon short ingot (crystal ID #1) and a germanium doped single crystal silicon full length ingot (crystal ID #2) were produced in a 200 mm FF furnace (SunEdison, S. Korea). Polycrystalline silicon and germanium were charged to a high purity quartz lined synthetic crucible (Toshiba). The charge for preparing the germanium doped single crystal silicon full length ingot (crystal ID #2) comprised 1.3 kg of 5N grade germanium and 180 kg of high resistivity polycrystalline silicon (>1000 Ohm·Cm). Additionally, 0.024 grams of phosphorus was added to the melt to provide a phosphorus dopant concentration of about $1.1 \times 10^6$ ppba. The charge was melted and a crystal was pulled according to the techniques disclosed herein. The single crystal silicon ingot was targeted for >16,000 Ohm·Cm resistivity by adjusting the dopant concentration in the melt before starting the crystal growth process. This was based on resistivity of the melt calculated by growing a short crystal with <200 mm diameter and <15 kg wt. The single crystal silicon ingot comprises <5.0 ppma Oi.

Example 2. Resistivity of Annealed Ingot

The germanium doped single crystal silicon full length ingot (crystal ID #2) prepared according to Example 1 was subjected to a thermal anneal procedure. Prior to anneal the pulled ingot, the pulled ingot was cropped by removing the seed and end cones. For analysis, the ingot was sliced at different positions, thereby preparing multiple slugs having a thickness of about 1350 micrometers. Each cropped slug was edge ground and subjected to a mixed acid etch to a final thickness of about 1180 micrometers, which was followed by lapped wafer cleaning to a final thickness of 1150 micrometers and pre-RTA clean. The slug was subjected to a thermal donor kill in a rapid thermal anneal at 750° C. at a temperature ramp of 360° C./minute. After lapping and anneal, the annealed slugs were cooled and held for four hours before four point probe measurement. The annealed slug was subjected to a four point probe measurement technique for resistivity and additional characteristics, as provided in Table 2.

TABLE 2

| Ingot ID | Recharge Sequence | Position (mm) | Oi (PPMA) | Resistivity after thermal donor kill anneal (ohm cm) | Resistivity after donor generation anneal (ohm cm) |
|---|---|---|---|---|---|
| #1 (Short Piece) | First | 0 | 12.942 | | |
| | | 150 | 2.879 | | |
| #2 (Last, 180 kg) | First | 150 | 3.225 | 24556 | 20560 |
| | | 445 | 2.564 | 51819 | 83720 |
| | | 687 | 3.211 | 224800 | 354200 |

Example 3. Wafer Mechanical Strength

Figure 10A:
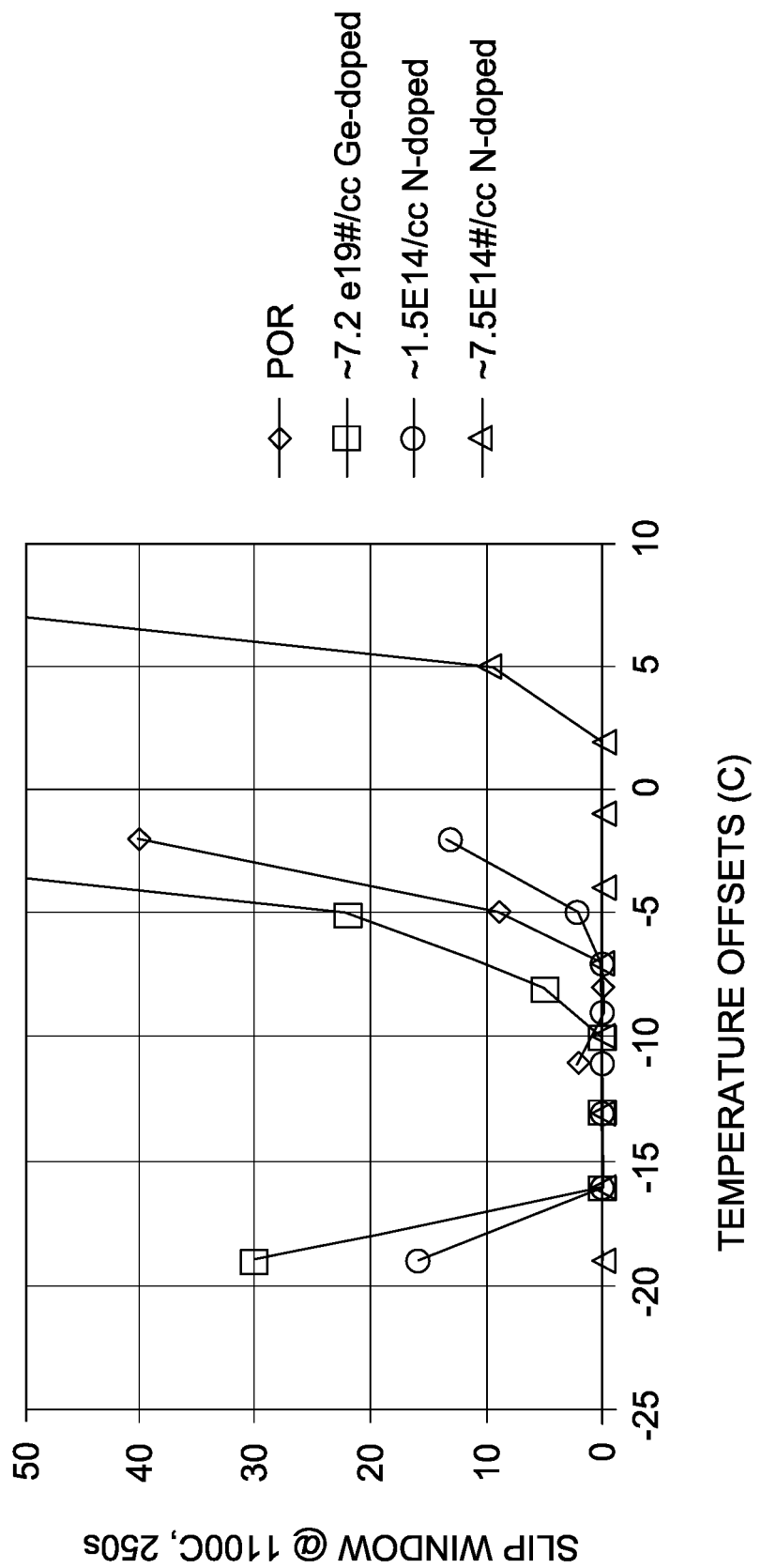
FIGS. 10A and 10B are graphs depicting the no-slip temperature window test according to Example 3.
Figure 10B:
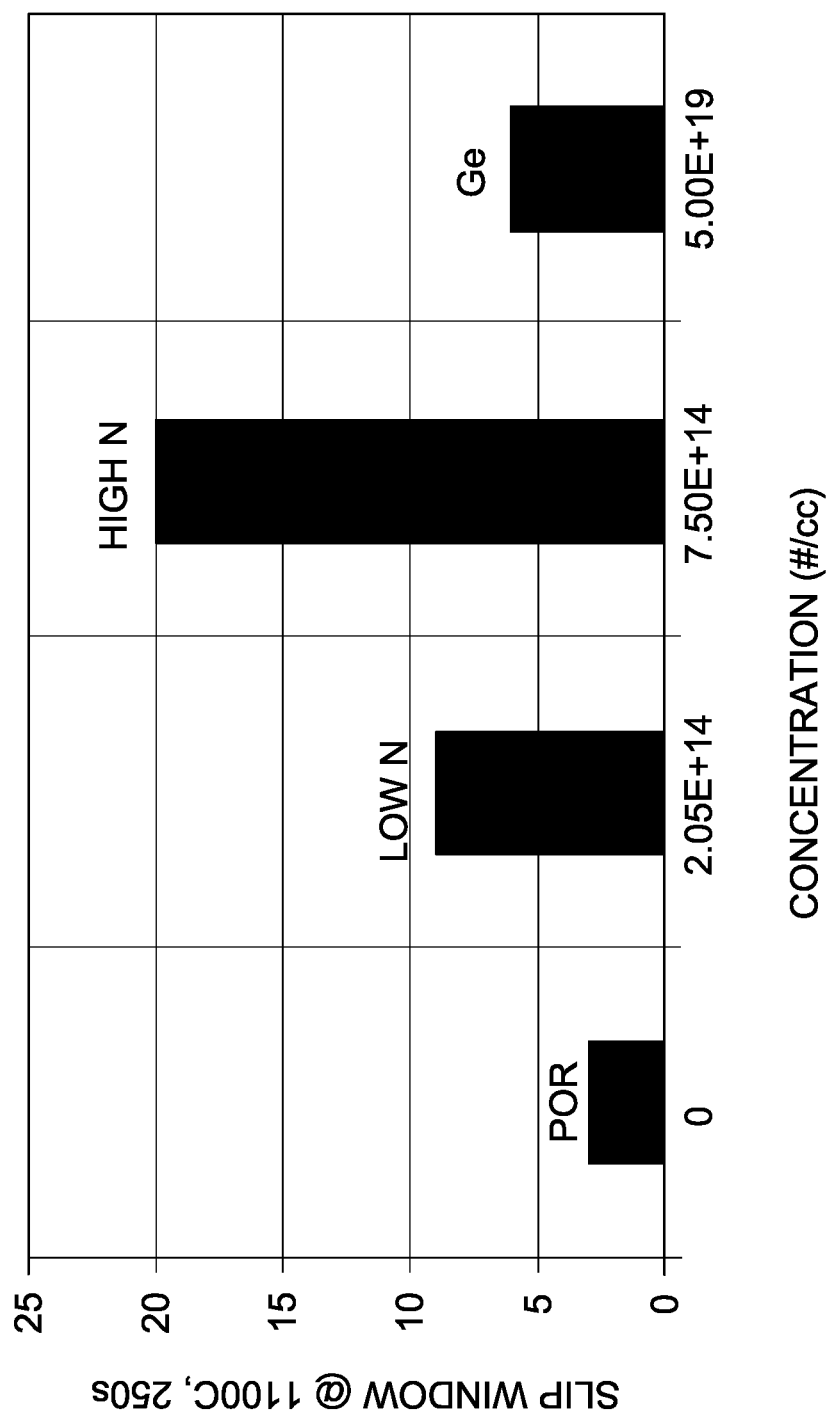

The mechanical strength of a single crystal silicon wafer sliced from the ingot prepared according to Example 1 is compared with non-germanium-doped silicon wafer (ID #0) also having low Oi using an EPI reactor slip generation test by a temperature ramp. According to this test, the lower the number of slip generated, the greater the mechanical strength. Thereby, a lower yield loss is expected. Further, the larger the no-slip temperature window by this test, the larger the process window during the SOI wafer and device manufacturing. As depicted by the graphs of FIGS. 10A and 10B, germanium doping and nitrogen doping provide a significant improvement of slip count. The non-germanium-doped silicon wafer demonstrated a ~3° C. temperature offset window at 1100° C., 250 s process condition. In comparison, the germanium doped wafer demonstrated a ~6° C. temperature offset window under similar condition. This improvement is significant enough to improve slip free processing of high resistivity low Oi wafer under much severe process condition.

Example 4. Wafer Mechanical Strength

Figure 11:
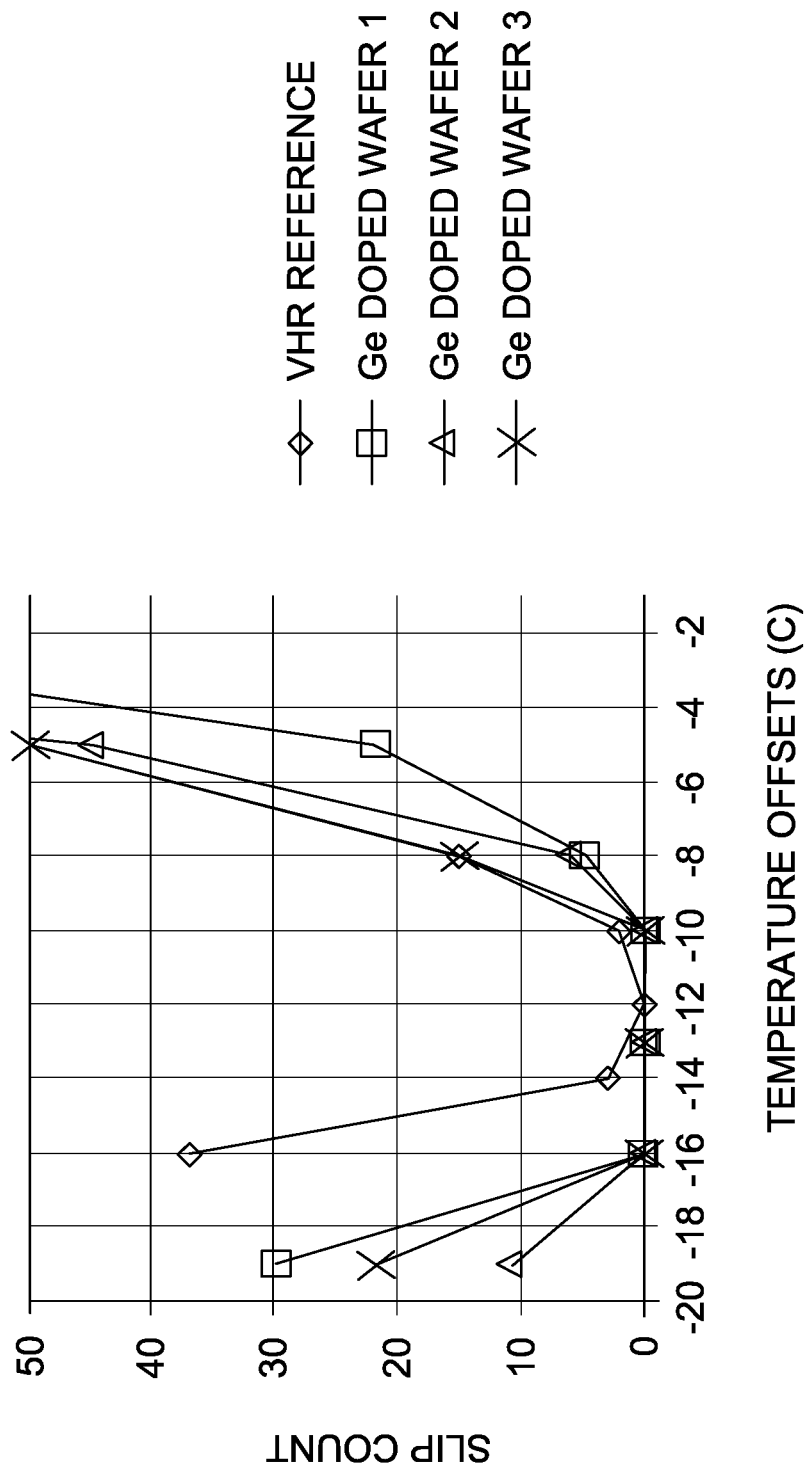
FIG. 11 is a graph depicting the no-slip temperature window test according to Example 4.

The mechanical strength of a single crystal silicon wafer sliced from the ingot prepared according to Example 1 is compared with non-germanium-doped silicon wafer (ID #0) also having low Oi using an EPI reactor slip generation test by a temperature ramp. According to this test, the lower the number of slip generated, the greater the mechanical strength. Thereby, a lower yield loss is expected. Further, the larger the no-slip temperature window by this test, the larger the process window during the SOI wafer and device manufacturing. As depicted by the graph of FIG. 11, germanium doping provides a significant improvement of slip count. The non-germanium-doped silicon wafer demonstrated a ~3° C. temperature offset window at 1100° C., 250 s process condition. In comparison, the germanium doped wafer demonstrated a ~6° C. temperature offset window under similar condition. This improvement is significant enough to improve slip free processing of high resistivity low Oi wafer under much severe process condition.

Example 5. Mechanical Strength

A nitrogen doped single crystal silicon ingot was produced in 200 mm FF furnace at SunEdison Semiconductor facility at S. Korea. Seed end N-concentration was targeted for ~$1.4 \times 10^{14}$ nitrogen atoms/cm$^3$ in the wafer by adding equivalent amount of silicon nitride during meltdown process (crystal ID #3). Similarly, another crystal was grown by targeting ~$5 \times 10^{14}$ nitrogen atoms/cm$^3$ concentration at seed end (crystal ID #4). Resistivity of the crystal was targeted for >3000 Ohm·Cm at seed end by adjusting the dopant concentration in the melt before starting the crystal growth process (based on resistivity of the melt calculated by growing a short crystal with <200 mm diameter and <15 kg wt). The process is optimized to get desired <6.0 ppma Oi.

A germanium doped single crystal silicon ingot (crystal ID #2) was produced in a 200 mm FF furnace at SunEdison facility at S. Korea. 1.3 kg on 5N grade Ge is co-melted with 180 kg of high resistivity Si (>1000 Ohm·Cm) in a high purity quartz lined synthetic crucible. Crystal was targeted for >16,000 Ohm·Cm resistivity by adjusting the dopant concentration in the melt.

The mechanical strength of the wafers are compared with non-germanium-doped silicon wafer (high resistivity, >1000 Ohm·Cm; and low Oi, <6.0 ppma) and different concentration of nitrogen and Ge doped low Oi using an EPI reactor slip generation test by a temperature ramp. The lower the number of slip generated by this test, the greater the mechanical strength, and lower yield loss is expected. Further, larger the no-slip temperature window, larger the process window during SOI wafer and device manufacturing. Based on this test, these is a significant improvement of slip count is observed. The non-germanium-doped silicon wafer has ~3° C. temperature offset window at 1100° C., 250 s process condition, while the low concentration nitrogen doping ($1.4 \times 10^{14}$ nitrogen atoms/cm$^3$) has 9° C. and high concentration N doping ($5 \times 10^{14}$ nitrogen atoms/cm$^3$) has >20° C. temperature offset. See Table 3. Ge doped wafer has ~6° C. temperature offset window under similar condition. This improvement is significant enough to improve slip free processing of high resistivity low Oi wafer under much severe process condition.

TABLE 3

| Ingot ID | Dopant and Concentration | Interstitial Oxygen Concentration (PPMA) | Slip Window at 1100° C., 250 s (° C.) |
|---|---|---|---|
| #0 | Non-doped | 2.58 | 3 |
| #2 | $7.00 \times 10^{19}$ germanium atoms/cm$^3$ | 3.45 | 6 |
| #3 | $2.05 \times 10^{14}$ nitrogen atoms/cm$^3$ | 2.9 | 9 |
| #4 | $7.50 \times 10^{14}$ nitrogen atoms/cm$^3$ | 3.7 | 20 |

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," is not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As various changes could be made in the above without departing from the scope of the invention, it is intended that all matter contained in the above description and shown in the accompanying drawings shall be interpreted as illustrative and not in a limiting sense.

What is claimed is:

1. A single crystal silicon wafer comprising:
   two major, parallel surfaces, one of which is a front surface of the single crystal silicon wafer and the other of which is a back surface of the single crystal silicon wafer, a circumferential edge joining the front and back surfaces of the single crystal silicon wafer, a bulk region between the front and back surfaces, and a central plane of the single crystal silicon wafer between the front and back surfaces of the single crystal silicon wafer, wherein:

(a) the bulk region comprises germanium at a germanium concentration of at least about $1 \times 10^{19}$ atoms/cm$^3$;
(b) the bulk region comprises interstitial oxygen at an interstitial oxygen concentration of less than about 6 ppma (New ASTM: ASTM F 121, 1980-1983; DIN 50438/1, 1978); and
(c) the bulk region of the single crystal silicon wafer has a resistivity of at least about 10,000 ohm cm.

2. The single crystal silicon wafer of claim 1 wherein the interstitial oxygen concentration is less than about 5 ppma.

3. The single crystal silicon wafer of claim 1 wherein the interstitial oxygen concentration is less than about 4 ppma.

4. The single crystal silicon wafer of claim 1 wherein the interstitial oxygen concentration is less than about 3 ppma.

5. The single crystal silicon wafer of claim 1 wherein the resistivity is at least about 15,000 ohm cm.

6. The single crystal silicon wafer of claim 1 wherein the resistivity is at least about 20,000 ohm cm.

7. The single crystal silicon wafer of claim 1 wherein the germanium concentration is at least about $1 \times 10^{19}$ atoms/cm$^3$ and less than about $1 \times 10^{22}$ atoms/cm$^3$.

8. The single crystal silicon wafer of claim 1 wherein the germanium concentration is at least about $5 \times 10^{19}$ atoms/cm$^3$ and less than about $1 \times 10^{22}$ atoms/cm$^3$.

9. The single crystal silicon wafer of claim 1 further comprising nitrogen at a nitrogen concentration of at least about $5 \times 10^{14}$ atoms/cm$^3$ and less than about $1 \times 10^{16}$ atoms/cm$^3$.

10. The single crystal silicon wafer of claim 1 further comprising nitrogen at a nitrogen concentration of at least about $1 \times 10^{15}$ atoms/cm$^3$ and less than about $1 \times 10^{16}$ atoms/cm$^3$.

11. A method of growing a single crystal silicon ingot, the method comprising:
preparing a silicon melt, wherein the silicon melt is prepared by melting polycrystalline silicon in a quartz lined crucible and adding a source of germanium to the quartz lined crucible; and
pulling the single crystal silicon ingot from the silicon melt, the single crystal silicon ingot comprising a central axis, a crown, an end opposite the crown, and a main body between the crown and the opposite end, the main body having a lateral surface and a radius, R, extending from the central axis to the lateral surface, wherein the main body of the single crystal silicon ingot comprises germanium at a germanium concentration of at least about $1 \times 10^{19}$ atoms/cm$^3$, further wherein the pulling conditions are sufficient to yield an interstitial oxygen concentration in the main body of the single crystal silicon ingot of less than about 6 ppma (New ASTM: ASTM F 121, 1980-1983; DIN 50438/1, 1978), and further wherein the main body of the single crystal silicon ingot has a resistivity of at least about 10,000 ohm cm.

12. The method of claim 11 wherein the pulling conditions are sufficient to yield an interstitial oxygen concentration in the main body of the single crystal silicon ingot of less than about 5 ppma.

13. The method of claim 11 wherein the pulling conditions are sufficient to yield an interstitial oxygen concentration in the main body of the single crystal silicon ingot of less than about 4 ppma.

14. The method of claim 11 wherein the pulling conditions are sufficient to yield an interstitial oxygen concentration in the main body of the single crystal silicon ingot of less than about 3 ppma.

15. The method of claim 11 wherein the main body of the single crystal silicon ingot has a resistivity of at least about 15,000 ohm cm.

16. The method of claim 11 wherein the main body of the single crystal silicon ingot has a resistivity of at least about 20,000 ohm cm.

17. The method of claim 11 wherein the main body of the single crystal silicon ingot comprises germanium at a germanium concentration of at least about $1 \times 10^{19}$ atoms/cm$^3$ and less than about $1 \times 10^{22}$ atoms/cm$^3$.

18. The method of claim 11 wherein the main body of the single crystal silicon ingot comprises germanium at a germanium concentration of at least about $5 \times 10^{19}$ atoms/cm$^3$ and less than about $1 \times 10^{22}$ atoms/cm$^3$.

19. The method of claim 11 further comprising adding a source of nitrogen to the quartz lined crucible and wherein the main body of the single crystal silicon ingot further comprises nitrogen at a nitrogen concentration of at least about $5 \times 10^{14}$ atoms/cm$^3$ and less than about $1 \times 10^{16}$ atoms/cm$^3$.

20. The method of claim 11 further comprising adding a source of nitrogen to the quartz lined crucible and wherein the main body of the single crystal silicon ingot further comprises nitrogen at a nitrogen concentration of at least about $1 \times 10^{15}$ atoms/cm$^3$ and less than about $1 \times 10^{16}$ atoms/cm$^3$.

21. A single crystal silicon ingot comprising:
a central axis, a crown, an end opposite the crown, and a main body between the crown and the opposite end, the main body having a lateral surface and a radius, R, extending from the central axis to the lateral surface, wherein:
(a) the main body of the single crystal silicon ingot comprises germanium at a germanium concentration of at least about $1 \times 10^{19}$ atoms/cm$^3$;
(b) the main body of the single crystal silicon ingot comprises interstitial oxygen at a concentration of less than about 6 ppma (New ASTM: ASTM F 121, 1980-1983; DIN 50438/1, 1978); and
(c) the main body of the single crystal silicon ingot has a resistivity of at least about 10,000 ohm cm.

22. The single crystal silicon ingot of claim 21 wherein the interstitial oxygen concentration is less than about 5 ppma.

23. The single crystal silicon ingot of claim 21 wherein the interstitial oxygen concentration is less than about 4 ppma.

24. The single crystal silicon ingot of claim 21 wherein the interstitial oxygen concentration is less than about 3 ppma.

25. The single crystal silicon ingot of claim 21 wherein the resistivity is at least about 15,000 ohm cm.

26. The single crystal silicon ingot of claim 21 wherein the resistivity is at least about 20,000 ohm cm.

27. The single crystal silicon ingot of claim 21 wherein the germanium concentration is at least about $1 \times 10^{19}$ atoms/cm$^3$ and less than about $1 \times 10^{22}$ atoms/cm$^3$.

28. The single crystal silicon ingot of claim 21 wherein the germanium concentration is at least about $5 \times 10^{19}$ atoms/cm$^3$ and less than about $1 \times 10^{22}$ atoms/cm$^3$.

29. The single crystal silicon ingot of claim 21 further comprising nitrogen at a concentration of at least about $5 \times 10^{14}$ atoms/cm$^3$ and less than about $1 \times 10^{16}$ atoms/cm$^3$.

30. The single crystal silicon ingot of claim 21 further comprising nitrogen at a concentration of at least about $1 \times 10^{15}$ atoms/cm$^3$ and less than about $1 \times 10^{16}$ atoms/cm$^3$.

* * * * *